US006566875B1

(12) United States Patent
Hasson et al.

(10) Patent No.: US 6,566,875 B1
(45) Date of Patent: May 20, 2003

(54) PORTABLE HYPERPOLARIZED GAS MONITORING SYSTEMS, COMPUTER PROGRAM PRODUCTS, AND RELATED METHODS USING NMR AND/OR MRI DURING TRANSPORT

(75) Inventors: Kenton C. Hasson, Durham, NC (US); Bradley A. Wheeler, Raleigh, NC (US)

(73) Assignee: Medi-Physics, Inc., Princeton, NJ (US)

( * ) Notice: Subject to any disclaimer, the term of this patent is extended or adjusted under 35 U.S.C. 154(b) by 0 days.

(21) Appl. No.: 09/334,341

(22) Filed: Jun. 16, 1999

Related U.S. Application Data
(60) Provisional application No. 60/121,221, filed on Feb. 23, 1999.

(51) Int. Cl.$^7$ ............................ G01V 3/00; G01R 33/28; F17C 13/02
(52) U.S. Cl. ........................ 324/309; 62/3.1; 62/45.1; 62/914; 62/49.1; 600/420; 604/20; 604/181
(58) Field of Search ..................... 62/600, 630, 420, 62/431, 62, 3.1, 45.1, 49.1, 914; 324/300–322; 604/20, 181; 600/420

(56) References Cited

U.S. PATENT DOCUMENTS

| | | |
|---|---|---|
| 3,642,851 A | 2/1972 | Bennett |
| 3,646,090 A | 2/1972 | Bennett |
| 3,657,363 A | 4/1972 | Dorko |
| 3,748,864 A | 7/1973 | Lofredo et al. ................. 62/22 |
| 3,966,781 A | 6/1976 | Atkinson et al. ..... 260/410.9 R |
| 3,989,705 A | 11/1976 | Werstiuk et al. ......... 260/290 P |
| 4,080,429 A | 3/1978 | Koeppe et al. ............. 423/262 |
| 4,157,495 A | 6/1979 | Grover et al. ................ 324/0.5 |
| 4,369,048 A | 1/1983 | Pence ............................ 55/66 |
| 4,417,909 A | 11/1983 | Weltmer, Jr. .................... 62/12 |
| 4,450,407 A | 5/1984 | Kwon et al. ................. 324/304 |
| 4,586,511 A | 5/1986 | Clark, Jr. .................... 128/653 |

(List continued on next page.)

FOREIGN PATENT DOCUMENTS

| | | |
|---|---|---|
| EP | 0495287 A2 | 7/1992 |
| EP | 0495287 A3 | 7/1992 |
| EP | 0620447 A3 | 10/1994 |
| EP | 0620447 A2 | 10/1994 |
| EP | 0495287 B1 | 5/1998 |
| EP | WO 00/50914 * | 8/2000 |
| WO | WO97/37177 | 10/1997 |
| WO | WO97/37178 | 10/1997 |
| WO | WO 97/37239 | 10/1997 |
| WO | WO98/02209 A2 | 1/1998 |
| WO | WO98/02209 A3 | 1/1998 |
| WO | WO/98/43701 | 10/1998 |
| WO | WO 98/58272 | 12/1998 |
| WO | WO 99/07415 | 2/1999 |
| WO | WO99/08941 | 2/1999 |
| WO | WO 99/14582 | 3/1999 |

(List continued on next page.)

OTHER PUBLICATIONS

Brian T. Saam and Mark S. Conradi article "Low Frequency NMR polarimeter for Hyperpolarized Gases". Apr. 1998 pp. 67–71.*
Wilms et al., "Polarimetry on dense samples of spin–polarized $^3$He by magnetostatic detection," Nucl. Instr. and Meth. in Phys. Res., A 401, pp. 491–498 (1997).

(List continued on next page.)

Primary Examiner—Edward Lefkowitz
Assistant Examiner—Tiffany A. Fetzner
(74) Attorney, Agent, or Firm—Myers Bigel Sibley & Sajovec PA

(57) ABSTRACT

A system, method, and computer program products and associated apparatus, to monitor and determine the polarization level of a quantity of hyperpolarized gas during transport. A portable device is configured to transmit an excitation pulse and analyze a response signal in transit to provide a polarization level corresponding to the hyperpolarized gas. Preferably, the monitoring system can provide magnetic field fluctuation feedback to the transport unit and adjust operating current to a solenoid. The system also can compensate for NMR frequency shifts that may appear in the measured response signal to provide a more accurate polarization level or "real" $T_1$ for the hyperpolarized gas.

41 Claims, 11 Drawing Sheets

U.S. PATENT DOCUMENTS

| | | | |
|---|---|---|---|
| 4,599,462 A | 7/1986 | Michl ........................ | 568/702 |
| 4,755,201 A | 7/1988 | Eschwey ...................... | 62/12 |
| 4,775,522 A | 10/1988 | Clark, Jr. ....................... | 424/9 |
| 4,793,357 A | 12/1988 | Lindstrom .................. | 128/654 |
| 4,862,359 A | 8/1989 | Trivedi et al. ......... | 364/413.05 |
| 4,914,160 A | 4/1990 | Azizian ................... | 525/329.3 |
| 4,977,749 A | 12/1990 | Sercel ........................ | 62/51.1 |
| 4,996,041 A | 2/1991 | Arai et al. ...................... | 424/9 |
| 5,007,243 A | 4/1991 | Yamaguchi et al. ......... | 62/51.1 |
| 5,039,500 A | 8/1991 | Shino et al. ................ | 423/262 |
| 5,046,498 A | 9/1991 | Fishman .................... | 128/653 |
| 5,161,382 A | 11/1992 | Missimer ................... | 62/46.1 |
| 5,186,924 A | 2/1993 | Fishman ........................ | 424/9 |
| 5,190,744 A | 3/1993 | Rocklage et al. ............. | 424/9 |
| 5,352,979 A | 10/1994 | Conturo ..................... | 324/307 |
| 5,357,959 A | 10/1994 | Fishman et al. ......... | 128/653.2 |
| 5,433,196 A | 7/1995 | Fiat ............................ | 128/632 |
| 5,494,655 A | 2/1996 | Rocklage et al. .......... | 424/9.36 |
| 5,509,412 A | 4/1996 | Bahn ....................... | 128/653.2 |
| 5,522,390 A | 6/1996 | Tuithof et al. ........... | 128/653.2 |
| 5,545,396 A | 8/1996 | Albert et al. ................. | 424/93 |
| 5,612,103 A | 3/1997 | Driehuys et al. .......... | 428/34.7 |
| 5,617,860 A | 4/1997 | Chupp et al. ............ | 128/653.4 |
| 5,642,625 A * | 7/1997 | Cates, Jr. et al. ............ | 62/55.5 |
| 5,809,801 A | 9/1998 | Cates, Jr. et al. ............. | 62/637 |
| 5,833,947 A | 11/1998 | Rocklage et al. .......... | 424/9.36 |
| 5,860,295 A | 1/1999 | Cates, Jr. et al. ............. | 62/637 |
| 6,128,918 A * | 10/2000 | Deaton et al. ................ | 62/610 |
| 6,237,363 B1 * | 5/2001 | Zollinger et al. ............ | 62/600 |
| 6,269,648 B1 * | 8/2001 | Hasson et al. ................ | 62/3.1 |
| 2001/0025493 A1 * | 10/2001 | Hasson et al. ................ | 62/3.1 |

FOREIGN PATENT DOCUMENTS

| | | |
|---|---|---|
| WO | WO 99/17105 | 4/1999 |
| WO | WO 99/17304 | 4/1999 |
| WO | WO 99/25243 | 5/1999 |
| WO | WO99/35508 | 7/1999 |

OTHER PUBLICATIONS

Saam et al.; "Low Frequency NMR Polarimeter for Hyperpolarized Gases," *Journal of Magnetic Resonance*, 134, 67–71 (1998).

Surka et al.; "Large hyperpolarized $^3$H quantities for $^3$He–MRI of the lung," *Proceedings of the International Society for Magnetic Resonance in Medicine, Fifth Scientific Meeting and Exhibition, Vancouver, B.C., Canada*, 1, 182 XP002116424 (Apr. 12–18, 1997).

Copy of International Search Report for PCT/US99/13557 (Dec. 10, 1999).

Albert et al., "$^{129}$Xe Relaxation Catalysis by Oxygen", Abstracts of the 11th Annual Meetings of the Society for Magnetic Resonance Medicine, Abstract No. 4710 (1992).

Albert et al., "Biological magnetic resonance imaging using laser–polarized $^{129}$Xe," Letters to Nature, vol. 370, pp. 199–201 (Jul. 21, 1994).

Albert et al., "Relaxation of $^{129}$Xe in Model Biological Systems: On Probing the Mechanism of General Anesthesia", Abstracts of the 11th Annual Meetings of the Society for Magnetic Resonance Medicine, Abstract No. 2104 (1992).

Albert et al., *Development of Hyperpolarized Noble Gas MRI*, Nucl. Inst. and Meth. in Phys. Res. A 402, pp. 441–453 (1998).

Albert et al., *Measurement of $^{129}$Xe T1 in Blood to Explore the Feasibility of Hyperpolarized $^{129}$Xe MRI*, Jour. Comp. Ass. Tomography, Vol. 19, No. 6 (Nov.–Dec. 1995).

Arimoto, et al., "Development of Measurement and Control System for Polarized $^3$He Ion Source Based on Electron Pumping," The 11th Symposium on Accelerator Science and Technology, Harima Science Garden City, pp. 14–16 (1997).

Augustine et al., *Low Field Magnetic Resonance Images of Polarized Noble Gases Obtained with a dc Quantum Interference Device*, App. Phys. Ltrs., vol. 72, No. 15, pp. 1908–1910 (Apr. 1998).

Bachert et al., "Hyperpolarized Helium–3 Nuclear Magnetic Resonance Imaging of Human Lungs," Proc. of 43rd Annual Meeting, J. of Nucl. Med., Poster Sessions, No. 1320, p. 296P.

Bachert et al., *Nuclear Magnetic Resonance Imaging of Airways in Humans with Use of Hyperpolarized $^3$He*, MRM 36, pp. 192–196 (1996).

Barany, M. et al., *High Resolution Proton Magnetic Resonance Spectroscopy of Human Brain and Liver*, Magn. Reson. Imaging, 5:393 (1987).

Becker et al., "Study Of Mechanical Compression Of Spin–Polarized $^3$He Gas", Nuclear Instruments And Methods In Physics Research, vol. A 346, pp. 45–51 (1994).

Bhaskar et al., "Efficiency of Spin Exchange between Rubidium Spins and $^{129}$Xe Nuclei in a Gas", Physical Review Letters, vol. 49, No. 1, pp. 25–28 (Jul. 5, 1982).

Bifone, et al., "NMR of laser–polarized xenon in human blood," Proc. Natl. Acad. Sci. USA, vol. 93, pp. 12932–12936 (Nov. 1996).

Bishop et al., *High–Order Multipolar Hyperpolarizabilities with Imaginary Frequency for H and He*, Int'l. Jour. of Quan. Chem., vol. 59, pp. 103–108 (1996).

Bishop et al., "The Interaction Polarizability and Interaction Second–Hyperpolarizability for He . . . He," Molecular Phys., vol. 88, No. 4, pp. 887–898 (1996).

Black et al., "In Vivo He–3 MR Images of Guinea Pig Lungs, Radiology," vol. 199, No. 3, pp. 867–870 (Jun. 1996).

Blumgart et al., "Studies on the Velocity of Blood Flow," J. Clin. Invest., 4:339–425 (1927).

Bock, "Simultaneous $T_2$* and Diffusion Measurements with $^3$He," Mag. Reson. in Med., vol. 38, No. 6, pp. 890–895 (1997).

Borman, "Xenon Used to Expand Magnetic Imaging," Chem. & Eng. News, vol. 72, No. 30, pp. 7–8 (Jul. 25, 1994).

Bouchiat et al., "Relaxation of Optically Pumped Rb Atoms on Paraffin–Coated Walls," Phys. Rev., vol. 147, No. 1 (Jul. 8, 1966).

Bouchiat et al., "Nuclear Polarization in He3 Gas Induced by Optical Pumping and Dipolar Exchange," Phys. Rev. Lett., vol. 5, No. 8, pp. 373–375 (1960).

Brochure, Jensen Inert Products, Gas Sampling Bags, jensen@jenseninert.com (copyright 1997).

Brunner et al., "Communications: Gas Flow MRI Using Circulating Laser–Polarized $^{129}$Xe," J. Mag. Res. vol. 138, pp. 155–159 (1999).

Burt et al., "Fluorinated Anesthetics as Probes of Lipophilic Environments in Tumors," J. Magn. Reson., 53:163 (1983).

Burt et al., The Fluorinated Anesthetic Halothane as a Potential NMR Biologic Probe, Biochem. Biophys. Acta., 805:375 (1984).

Cain et al., "Nuclear Spin Relaxation Mechanisms and Mobility of Gases in Polymers," J. Phys. Chem., vol. 94, No. 5, pp. 2128–2135 (1990).

Carver, T.R., "Optical Pumping," Science, vol. 141, No. 3581, pp. 599–608 (1963).

Cates et al., "Laser Production of Large Nuclear–Spin Polarization in Frozed Xenon", Phys. Rev. Lett., vol. 65, No. 20, pp. 2591–2594 (1990).

Cates et al., "Rb–$^{129}$Xe spin–exchange rates due to binary and three–body collisions at High Xe pressures", Physical Review A, vol. 45, p. 4631 (1992).

Cates, *New Results from Spin–Exchange Optical Pumping*, Am. Inst. Phys. pp. 3–15 (1998).

Chawla, et al., *In Vivo Magnetic Resonance Vascular Imaging Using Laser–Polarized 3He Microbubbles*, Proc. Natl. Acad. Sci, vol. 95, pp. 10832–10835 (Sep. 1998).

Chen et al., "MR Microscopy of Lung Airways with Hyperpolarized $^3$He," Mag. Reson. in Med., vol. 39, No. 1, pp. 79–84 (Jan. 1998).

Chernikov, S.V. et al., *1083nm Ytterbium Doped Fibre Amplifier for Optical Pumping of Helium*, Elec. Ltrs., vol. 33, No. 9, 3 pages (Apr. 24, 1997).

Colegrove et al., Polarization of He$^3$ Gas by Optical Pumping,: Phys. Rev., vol. 132, No. 6, pp. 2561–2572 (1963).

Constantinesco et al., "MRI of Hyperpolarized Gases in Competition with Nuclear Medicine?" Médecine Nucléaire, vol. 21, No. 5, pp. 285–292 (1997–98) (French).

Cullen, et al., Science, vol. 113, pp. 580–582 (May 18, 1951).

Cummings et al., "Optical pumping of Rb vapor using high–power $Ga_{1-x}A_x$ As diode laser arrays", Phys. Rev. A, vol. 51, No. 6, pp. 4842–4851 (1995).

Darrasse, et al., "Low–field $^3$He nuclear magnetic resonance in human lungs," C.R. Acad. Sci., Paris, t. 324, Series II b, pp. 691–700 (1997) (French).

De Schepper, "The HERMES $^3$He target," Mass. Inst. Tech., pp. 16–25.

Diehl et al., "Nuclear Magnetic Relaxation of the $^{129}$Xe and $^{131}$Xe Isotopes of Xenon Gas Dissolved in Isotropic and Anisotropic Liquids," J. Magn. Reson., vol. 88, pp. 660–665 (1990).

Driehuys et al., "High–volume production of laser–polarized $^{129}$Xe", Appl. Phys. Lett., vol. 69, No. 12 (Sep. 16, 1996).

Driehuys et al., "Surface Relaxation Mechanisms of laser–Polarized 129Xe," 74 Phys. Rev. Lett., No. 24, pp. 4943–4946 (Jun. 12, 1995).

Ebert et al., "Nuclear magnetic resonance imaging with hyperpolarixed helium–3," Lancet (NA ed), vol. 347, pp. 1297–1299 (May 1996).

Ernst et al., Chapter 10, "Nuclear Magnetic Resonance Imaging," Prin. of Nuclear Mag. Reson. in One and Two Dimensions (1987).

Evers et al., "Correlation between the anaesthetic effect of halothane and saturable binding in brain," Nature, vol. 328, pp. 157–160 (Jul. 9, 1987).

Freed, "Dynamic Effects of Pair Correlation Functions on Spin Relaxation by Translational Diffusion in Liquids. II. Finite Jumps and Independent $T_1$ Processes," 68 J. Chem. Phys., vol. 9, pp. 4034–4037 (1978).

Fullerton et al., Chapter 3 "Relaxation of Biological Tissues," Biomedical Magnetic Resonance Imaging: Principles, Methodology, and Applications, pp. 115–155, (1988).

Gao et al., "Magnetization and Diffusion Effects in NMR Imaging of Hyperpolarized Substances," Mag. Reson. in Med., vol. 37, No. 1 pp. 153–158 (Jan. 1997).

Gatzke et al., "Extraordinarily Slow Nuclear Spin Relaxation in Frozen Lazer–Polarized $^{129}$Xe", Phys. Rev. Lett., vol. 70, No. 5, pp. 690–693 (Feb. 1, 1993).

George, "The Sharper Image: MRIs and Xenon Gas," Jour. of NIH Res., vol. 6, No. 12, pp. 42–44 (Dec. 1994).

Glover et al., Research Directions in MR Imaging[1], Radiology., vol. 207, pp. 289–295, (1998).

Grover, B.D., "Noble–Gas NMR Detection through Noble–Gas–Rubidium Hyperfine Contact Interaction," Phys. Rev. Lett., vol. 40, No. 6, pp. 391–392 (1978).

Hadeishi et al., "Nuclear Alignment of the $^1S_0$ Ground State of $^{131}$Xe by Electron Pumping and Metastability–Exchange Collisions," Phys. Rev. Lett., vol. 19, p. 211–213 (1967).

Happer et al., "An Optical Pumping Primer," Hyperfine Interactions, vol. 38, pp. 435–470 (1987).

Happer et al., "Polarization of the nuclear spins of noble–gas atoms by spin exchange with optically pumped alkali–metal atoms," Phys. Rev. A, vol. 29, No. 6, p. 3092–3110 (Jun. 1984).

Hardy et al., "Broadband nuclear magnetic resonance pulses with two–dimensional spatial selectivity," J. Appl. Phys., vol. 66, No. 4, pp. 1513–1516 (Aug. 15, 1989).

Hardy et al., "Correcting for Nonuniform k–Space Sampling in Two–Dimensional NMR Selective Excitation," Jnl. Magnetic Resonance, vol. 87, pp. 639–645 (1990).

Hardy et al., "Spatial Localization in Two Dimensions Using NMR Designer Pulses," Jnl. Magnetic Resonance, vol. 82, pp. 647–654 (1989).

Heil et al., "Very long nuclear relaxation times of spin polarized helium 3 in metal coated cells," Physics Letters A 201, pp. 337–343 (1995).

Hou, et al., "Optimization of Fast Acquisition Methods for Whole–Brain Relative Cerebral Blood Volume (rCBV) Mapping with Susceptibility Contrast Agents," J. Mag. Res. Imaging, vol. 9 pp. 233–239 (1999).

Hunt et al., "Nuclear Magnetic Resonance of $^{129}$Xe in Natural Xenon," Phys. Rev., vol. 130, p. 2302–2305 (Jun. 15, 1963).

Imai et al., "LCBF Values Decline While Lλ Values Increase During Normal Human Again Measured by Stable Xenon–enhanced Computed Tomography," Neuroradiology, vol. 30, p. 463 (1988).

Jaduszliwer et al., "Optical spin polarization and state–sensitive detection of a cesium atomic beam," Phys. Rev. A, vol. 48, No. 3, pp. 2102–2107 (Sep. 1993).

Jameson et al., "Nuclear Spin Relaxation by Intermolecular Magnetic Dipole Coupling in the Gas Phase. 129Xe in Oxygen," J. Chem. Phys., vol. 89, p. 4074 (1988).

Kaatz, "A comparison of molecular hyperpolarizabilities from gas and liquid," Jour. Chemical Physics, vol. 108, No. 3, pp. 849–856 (Jan. 15, 1998).

Kanal et al., Chapter 2 in Biomedical Magnetic Imaging, Wehrli, F.W. et al., eds., pp. 47–112, VCH Publishers, New York (1988).

Kauczor et al., "Imaging of the Lungs Using 3He MRI: Preliminary Clinical Experience in 18 Patients with and without Lung Disease," JMRI, vol. 7, No. 3, pp. 538–543 (1997).

Kauczor et al., "MRI Using Hyperpolarized Noble Gases," Eur. Radiol., vol. 8, No. 5, Abstract (1998).

Kauczor et al., "Normal and Abnormal Pulmonary Ventilation: Visualization at Hyperpolarized He–3 MR Imaging[1]," Radiology, vol. 201, No. 2, pp. 564–568 (1996).

Kauczor et al., The helium–3 MRT of Pulmonary Ventilation; the Initial Clinical Applications, Abstract, Rofo Fortschr Geb Rontgenstru Neuen Bildegeb Verfahr, vol. 166, No. 3 (Mar. 1997).

Kendall et al., "Xenon as a Contrast Agent for Computed Tomography," J. Neuroradiology, vol. 8, No. 3 (1981).

Knudsen et al., "Blood–brain barrier permeability measurements by double–indicator method using intravenous injection," pp. H987–H999 (Jul. 1993).

Laloe et al., AIP Conf. Proc. #131, Workshop on Polarized $^3$He Beams and Targets (1984).

Lassen, "Cerebral Transit of an Intravascular Tracer May Allow Measurement of Regional Blood Volume But Not Regional Blood Flow," 4 J. Cereb. Blood Flow and Metab. pp. 633–634 (1984).

Le Roux et al., "Gas Transport Properties of Surface Fluorinated Poly (vinyltrimethyl–silane) Filmes and Composite Membranes," J. Membrane Sci., vol. 90, pp. 55–68 (1994).

Li et al., "Long–range, collision–induced hyperpolarizabilities of atoms or centrosymmetric linear molecules: Theory and numerical results for pairs containing H or He," J. Chem. Phys., vol. 105, No. 24, pp. 10954–10968 (Dec. 22, 1996).

Lockhart et al., Absence of Abundant Binding Sites for Anesthetics in Rabbit Brain: An In Vivo NMR Study, Anesthesiology, vol. 73, p. 455 (1990).

Long et al., J. Am. Chem. Soc., vol. 115, p. 8491 (1993).

MacFall et al., "Human Lung Air Spaces: Potential for MR Imaging with Hyperpolarized He–$3^1$," Radiology, vol. 200, No. 2, pp. 553–558 (1996).

Manabe et al, "0.1–T Human Fat/Water Separation by SIDAC," Mag. Reson. in Med., vol. 5, pp. 492–501 (1987).

Martin, "The Pharmacokinetics of Hyperpolarized Xenon: Implications for Cerebral MRI," Jour. Magn. Reson. Imag., vol. 7, No. 5, pp. 848–854 (Sep.–Oct. 1997).

Middleton et al., "MR Imaging With Hyperpolarized $^3$He Gas", Magnetic Resonance In Medicine, vol. 33, pp. 271–275 (1995).

Middleton, "The Spin Structure of The Neutron Determined Using A Polarized $^3$He Target", Ph.D. Dissertation, Princeton University (1994).

Miller et al., "Xenon NMR: Chemical shifts of a general anesthetic common solvents, proteins, and membranes", Proc. of the Nat. Acad. of Sci. (USA), vol. 78, No. 8, pp. 4946–4949 (Aug. 1981).

Miller, "$^{129}$Xe NMR in Polymers," Rubber Chem. and Tech., vol. 66, p. 455 (1993).

Mohr et al., "Surface Fluorination of Composite Membranes. Part I. Transport Properties," J. of Membrane Sci., vol. 55, pp. 131–148 (1991).

Moschos, A. et al., "Nuclear Magnetic Relaxation of Xenon–129 Dissolved in Organic Solvents," J. Mag. Reson., vol. 95, pp. 603–606 (1991).

Mugler, III et al. Gradient–Echo MR Imaging, RSNA Categorical Course in Physics: The Basic Physics of MR Imaging[1], U. of VA Health Sci. Ctr., pp. 71–88 (1997).

Mugler, III et al., "MR Imaging and Spectroscopy Using Hyperpolarized 129Xe Gas: Preliminary Human Results," 37 Magn. Reson. in Med., vol. 37, No. 6, pp. 809–815 (1997).

Nacher et al. , *Recent Results on Hyperpolarized $^3$He–$^4$He Liquid Mixtures*, Czechoslovak J. of Phys., vol. 46 Suppl. S6, pp. 3025–3032 (1996).

Navon et al., "Enhancement of Solution NMR and MRI with Laser–Polarized Xenon," Science, vol. 271, pp. 1848–1851.

Newbury et al., "Gaseous $^3$He–$^3$He Magnetic Dipolar Spin Relaxation," Phys. Rev. A, vol. 48, No. 6, pp. 4411–4420 (1993).

Norberg, R. E., in Rare Gas Solids, eds. Hohler, G., Springer–Verlag, New York (1984).

Ottinger et al., "Broadening of the Rb Resonance Lines by the Noble Gases," Phys. Rev. A, vol. 11, pp. 1815–1828 (1975).

Patyal, "Longitudinal Relaxation and Diffusion Measurements Using Magnetic Resonance Signals from Laser–Hyperpolarized $^{129}$Xe Nuclei," J. Magn. Reson., vol. 126, No. 1, pp. 58–65, May 1997.

Pauly, "Permeability and Diffusion Data," The Polymer Handbook, VI, pp. 435–449.

Pennisi, Breathe (xenon) deeply to see lungs clearly, Sci. News, vol. 146, p. 70.

Pfeffer et al., "$^{129}$Xe gas NMR spectroscopy and imaging with a whole–body imager," J. Mag. Reson., Ser. A., vol. 108, No. 1, pp. 106–109 (May 1994).

Pollack, G.L. et al., "Solubility of xenon in liquid n–alkanes: Temperature dependence and thermodynamic functions," J. Chem. Phys., vol. 7, No. 6, pp. 3221–3229 (Sep. 15, 1982).

Pollack, G.L. et al., "Solubility of xenon in liquid n–alkanois: Thermodynamic functions in simple polar liquids," J. Chem. Phys., 81 (7) pp. 3239–3246 (Oct. 1, 1984).

Raftery et al., "High–Field NMR of Adsorbed Xenon Polarized by Laser Pumping," Phys. Rev. Lett., vol. 66, No., pp. 584–587 (1991).

Raftery, D. et al., "NMR of optically pumped xenon thin films", Chem. Phys. Lett., vol. 191, No. 5, pp. 385–390 (Apr. 8, 1992).

Reif, "Fundamentals of Statistical and Thermal Physics," McGraw–Hill, Ch. 12–14, pp. 461–493 (1965).

Rinck et al., "NMR–Imaging of Fluorine–Containing Substances 19–Fluorine Ventilation and Perfusion Studies!", vol. 140, No. 3, pp. 239–243 (Mar. 1984) (German).

Rinck et al., "An Introduction to Magnetic Resonance in Medicine," George Thieme Verlag, Sttugart/New York (1990).

Robillard, Jr. et al., "Aromatic Hydrophobes and β–Lactoglobulin A. Thermodynamics of Binding," Biochemistry, 11:3835–3840 (1972).

Romalis et al., "Accurate $^3$He Polarimetry Using the Rb Zeeman Frequency Shift Due to the Rb– $^3$He Spin–Exchange Collisions," Phys. Rev. A, vol. 58, No. 4, pp. 3004–3011 (Oct. 1998).

Ruth et al., "Production of Nitrogen–Free, Hyperpolarized $^{129}$Xe Gas," Appl. Phys. B, vol. 68, pp. 93–97 (1999).

Saam et al., "Nuclear Relaxation of$^3$He in the Presence of O$_2$," Phys. Rev. A, vol. 52, pp. 862–865 (1995).

Saam et al., Edge Enhancement Observed with Hyperpolarized $^3$HE, Chem. Phys. Ltrs., vol. 263, pp. 481–487 (1996).

Sauer et al., "Laser–Polarized Liquid Xenon", Chem. Phys. Lett., vol. 277, pp. 153–158 (Oct. 3 1997).

Schad et al., "Hyperpolarized Gases—A New Type of MR Contrast Agents?," Acta Radiologica 38, Suppl. 412, pp. 43–46 (1997).

Schaefer, S.R. et al. "Frequency shifts of the magnetic–resonance spectrum of mixtures of nuclear spin–polarized noble gases and vapors of spin–polarized alkali–metal atoms," Phys. Rev. A., vol. 39, No. 11, pp. 5613–5623 (1989).

Schaefer, S.R. et al., "Determination of spin–exchange parameters between optically pumped rubidium and $^{83}$Kr," Phys. Rev. A., vol. 41, No. 11, pp. 6063–6070 (1990).

Schearer, L.D., "Optical Pumping of Neon ($^3P_2$) Metastable Atoms," Phys. Rev., vol. 180, No. 1, pp. 83–90 (1969).

Schearer, L.D., "Optical Pumping of Neon Metastable ($^3P_2$) Atoms," Phys. Rev. Lett., vol. 21, No. 10, pp. 660–661 (Sep. 2, 1968).

Schearer, L.D., "Optical Pumping of $^3P_2$ Argon and Xeon Atoms," Phys. Lett., vol. 28A, No. 9, pp. 660–661 (Feb. 10, 1969).

Schearer, L.D., "Depolarization Cross Sections for the Metastable Noble Gases by Optical Pumping," Phys. Rev., vol. 188, No. 1, pp. 505–506 (Dec. 5, 1969).

Schmidt et al., "Diffusion Imaging with Hyperpolarized $^3$He Gas," Jour. Mag. Reson., vol. 129, pp. 184–187 (1997).

Schmidt et al., "Nuclear Magnetic Resonance Imaging with Hyper–polarized Noble Gases," Los Alamos National Lab. (1997).

Schoenborn, B.P., *"Binding of Xenon to Horse Haemoglobin,"* Nature, 208:760 (1965).

Shang–Yi, "Broadening, Asymmetry and Shift of Rubidium Resonance Lines Under Different Pressures of Helium and Argon up to 100 Atomspheres," Phys. Rev., vol. 58, pp. 1051–1058 (1940).

Simonsen et al., "CBF and CBV Measurements by USPIO Bolus Tracking: Reproducibility and Comparison with Gd–Based Values," J. of Mag. Reson. Imag., vol. 9, pp. 342–347 (1999).

Sled et al., "Standing–Wave and RF Penetration Artifacts Caused by Elliptic Geometry: An Electrodynamic Analysis of MRI," IEEE Transactions on Medical Imaging, vol. 17, No. 4, pp. 653–662 (Aug. 1998).

Song et al., "Effects of Diffusion on Magnetic Resonance Imaging of Laser–Polarized Xenon Gas," Jour. Chem. Phys., vol. 108, No. 15, pp. 6233–6239 ( Apr. 1998).

Song et al., "Spin–Polarized $^{129}$Xe Gas Imaging of Materials," J. Mag. Reson., Series A 115, pp. 127–130 (1995).

Susskind, H. et al., "Studies of Whole–Body Retention and Clearance of Inhaled Noble Gases," Prog. Nucl. Med., 5:13 (1978).

Susskind, H. et al., "Xenon–127 Ventilation Studies," Prog. Nucl. Med., 5:144 (1978).

Tilton, Jr., et al, "Nuclear Magnetic Resonance Studies of Xenon–129 with Myoglobin and Hemoglobin," Biochemistry, vol. 21, No. 26, pp. 6850– (1982).

Tongier et al., "Use of Cuffed Oropharyngeal Airway (COPA) as an Alternative to the LMA for Providing Positive Pressure Ventilation during Ambulatory Anethesia," Anesthesiology, vol. 89, No. 3A (Sep. 1996).

Wagshul et al., "Laser Optical Pumping of High–Density Rb in Polarized $^3$He Targets," Phys. Rev. A, vol. 49, p. 3854–3869 (1994).

Wagshul et al., "Optical Pumping of High–Density Rb With a Broadband Dye Laser and GaAlAs Siode Laser Arrays: Application to $^3$He Polarization," Phys. Rev. A., vol. 40, No. 8, pp. 4447–4454 (1989).

Wagshul, "In Vivo MR Imaging and Spectroscopy Using Hyperpolarized 129Xe," Mag. Reson. Med., vol. 36, No. 2, pp. 183–191 (Aug. 1996).

Wehrli, F.W. et al., eds., Biomedical Magnetic Resonance Imaging, Principles, Methodology, and Applications, Chapter 1 (1988).

Wehrli, "Principles of Magnetic Resonance," Chapter 1.

Wilcock, R.J. et al., "Solubilities of gases in liquids II. The solubilities of He, Ne, Ar, Kr, O2, $N_2$, CO, $CO_2$, $CH_4$, $CF_4$, and SF6 in n–octane 1–octanol, n–decane, and 1–decanol," J. Chem. Thermodyn., 10:317 (1978).

Wilson, E.K., "Hyperpolarized Gases Set NMR World Spinning," C&EN, vol. 74, No. 52, pp. 21–24 (Dec. 23, 1996).

Wishnia, A., "Substrate Specificity at the Alkane Binding Sites of Hemoglobin and Myoglobin," Biochemistry, vol. 8, No. 12, pp. 5064–5069 (Dec. 1969).

Wood, "Fourier Imaging, Chapter 2, Physics," pp. 21–66.

Wu et al., "Experimental Studies of Wall Interactions of Adsorbed Spin–Polarized $^{131}$Xe Nuclei," Phys. Rev. A, vol. 42, No. 5 (Sep. 01, 1990).

Wyrwicz, A.M. et al., "Multiple environments of fluorinated anesthetics in intact tissues observed with $^{19}$F NMR spectroscopy," FEBS Lett., 162:334 (1983).

Wyrwicz, A.M. et al., "Noninvasive Observations of Fluorinated Anesthetics in Rabbit Brain by Fluorine–19 Magnetic Resonance," Science 222:428 (1983).

Yen, W.M. et al., "Nuclear Magnetic Resonance of Xe129 in Solid and Liquid Xenon," Phys. Rev., 131:269 (1963).

Yonas, H. et al., "Determination of Irreversible Ischemia by Xenon–Enhanced Computed Tomographic Monitoring of Cerebral Blood flow in Patients with Symptomatic Vasospasm," Neurosurgery, 24:368 (1989).

Yonehara et al., "Design of Rb Cell for Polarized $^3$He Ion Source Based on Electron Pumping," The 11th Symp. on Accelerator Sci. & Tech., Harima Sci. Garden City, pp. 174–175 (1997).

Zeng et al., "Experimental determination of the rate constants for spin exchange between optically pumped K, Rb, and Cs atoms and $^{129}$Xe nuclei in alkali–metal—noble–gas van der Waals molecules," Physical Review A, vol. 31, No. 1, p. 260–278 (Jan. 1985).

Zeng et al., "Wall Relaxation of Spin Polarized $^{129}$Xe Nuclei," Phys. Ltrs., vol. 96A, No. 4 (Jun. 27, 1983).

Zhao et al., "Biomedical Imaging Using Hyperpolarized Noble Gas MRI: Pulse Sequence Considerations," Nucl. Instr. and Meth. in Phys. Res. A 402, pp. 454–460 (1998).

* cited by examiner

PULSE PARAMETERS FOR PORTABLE POLARIMETRY

| PORTABLE POLARIMETRY | |
|---:|:---|
| PULSE TIME (ms) | 0.10 |
| POST MUTE (ms) | 1.00 |
| PULSE FREQUENCY (kHz) | 24.00 |
| PULSE AMPLITUDE (V) | 0.25 |
| MAX. SAMPLES | 10,000 |
| ACQUISITION TIME (ms) | 20.00 |
| TRANSIENT LENGTH (ms) | 0.00 |
| GAIN | 0.5 |

Exit   Based upon a   Save to file
       Reference Frequency of:

23.10 kHz

Look UpChart

Frequency(kHz) Correction Factor (mv)

| Frequency (kHz) | Correction Factor (mv) |
|---|---|
| 22.400 | 1.540 |
| 22.450 | 1.474 |
| 22.500 | 1.411 |
| 22.550 | 1.360 |
| 22.600 | 1.298 |
| 22.650 | 1.252 |
| 22.700 | 1.203 |
| 22.750 | 1.153 |
| 22.800 | 1.116 |
| 22.850 | 1.081 |
| 22.900 | 1.047 |
| 22.950 | 1.037 |
| 23.000 | 1.014 |
| 23.050 | 1.006 |
| 23.100 | 1.000 |
| 23.150 | 1.011 |
| 23.200 | 1.025 |
| 23.250 | 1.050 |
| 23.300 | 1.074 |
| 23.350 | 1.107 |
| 23.400 | 1.149 |
| 23.450 | 1.194 |
| 23.500 | 1.250 |
| 23.550 | 1.299 |
| 23.600 | 1.361 |
| 23.650 | 1.417 |
| 23.700 | 1.482 |
| 23.750 | 1.555 |
| 23.800 | 1.621 |
| 23.850 | 1.695 |

PORTABLE HYPERPOLARIZED GAS MONITORING SYSTEMS, COMPUTER PROGRAM PRODUCTS, AND RELATED METHODS USING NMR AND/OR MRI DURING TRANSPORT

RELATED APPLICATIONS

This application claims the benefit of priority from Provisional Application Serial No. 60/121,221, filed Feb. 23, 1999 entitled "Portable Hyperpolarized Gas Monitoring System, Computer Program Products, and Related Methods." The contents of which are hereby incorporated by reference as if recited in full herein.

This invention was made with Government support under National Institute of Health Grant Number R43HL62756-01. The United States Government has certain rights in this invention.

FIELD OF THE INVENTION

The present invention relates generally to systems of determining or monitoring the condition of hyperpolarized gas, such as monitoring the polarization level of the hyperpolarized gas during transport. The hyperpolarized gases are particularly suitable for MR imaging and spectroscopy applications.

BACKGROUND OF THE INVENTION

Inert gas imaging ("IGI") using hyperpolarized noble gases is a promising recent advance in Magnetic Resonance Imaging (MRI) and MR spectroscopic technologies. Conventionally, MRI has been used to produce images by exciting the nuclei of hydrogen molecules (present in water protons) in the human body. However, it has recently been discovered that polarized noble gases can produce improved images of certain areas and regions of the body, which have heretofore produced less than satisfactory images in this modality. Polarized Helium-3 ("$^3$He") and Xenon-129 ("$^{129}$Xe") have been found to be particularly suited for this purpose. Unfortunately, as will be discussed further below, the polarized state of the gases are sensitive to handling and environmental conditions and can, undesirably, decay from the polarized state relatively quickly.

Various methods may be used to artificially enhance the polarization of certain noble gas nuclei (such as $^{129}$Xe or $^3$He) over the natural or equilibrium levels, i.e., the Boltzmann polarization. Such an increase is desirable because it enhances and increases the MRI signal intensity, allowing physicians to obtain better images of the substance in the body. See U.S. Pat. No. 5,545,396 to Albert et al., the disclosure of which is hereby incorporated by reference as if recited in full herein.

A "$T_1$" decay constant associated with the hyperpolarized gas's longitudinal relaxation time is often used to characterize the length of time it takes a gas sample to depolarize in a given situation. The handling of the hyperpolarized gas is critical because of the sensitivity of the hyperpolarized state to environmental and handling factors and thus the potential for undesirable decay of the gas from its hyperpolarized state prior to the planned end use, e.g., delivery to a patient for imaging. Processing, transporting, and storing the hyperpolarized gases—as well as delivering the gas to the patient or end user—can expose the hyperpolarized gases to various relaxation mechanisms such as magnetic field gradients, surface-induced relaxation, hyperpolarized gas atom interactions with other nuclei, paramagnetic impurities, and the like.

Multiple relaxation mechanisms can arise during production and transport of the hyperpolarized gas. These problems can be particularly troublesome when transporting the hyperpolarized gas from a production site to a (remote) use site. In transit, the hyperpolarized gas can be exposed to many potentially depolarizing influences. Indeed, the polarized state of the gas can be unknowingly destroyed and undesirably transported to a use site in a clinically ineffective polarized state.

There is, therefore, a need to be able to monitor the status of the hyperpolarized gas and/or its environment during transport or storage so as to minimize exposure to depolarizing effects during transport. Improved monitoring methods and systems are desired so that more accurate measurements can be achieved and/or so that the hyperpolarized product can retain sufficient polarization to allow effective imaging at delivery when transported over longer transport distances in various (potentially depolarizing) environmental conditions and for longer time periods from the initial polarization than has been viable previously.

OBJECTS AND SUMMARY OF THE INVENTION

It is therefore an object of the present invention to provide a portable monitoring system which can determine the polarization level of the hyperpolarized gas (and/or hyperpolarized gas products) during transport.

It is another object of the present invention to provide a monitoring system that can automatically adjust a magnetic holding field to a predetermined or optimal value. By so doing, the resonant frequency of the gas can be shifted above that of potentially substantially depolarizing environmental conditions during movement of the hyperpolarized gas products from a production site to a remote use site, thus increasing the usable lifespan of the hyperpolarized gas products.

It is also an object of the present invention to provide a portable monitoring system that is configured to engage with a portable transport unit or shipping container for transporting a quantity of hyperpolarized gas therein.

It is a further object of the present invention to provide a portable system which can provide information to a user and which allows user input to react to the information about gas-related parameters, thereby allowing a user to be alerted to and thus take action to reduce the likelihood of any introduction of substantially depolarizing factors onto the hyperpolarized gases (such as unprotected exposure to stray magnetic gradients).

It is another object of the present invention to provide a method for determining the polarization level of a quantity of hyperpolarized gas at successive intervals in time to determine the effectiveness of the hyperpolarized product and to determine the overall polarization decay rate.

It is yet another object of the present invention to provide a method of reliably identifying gas polarization values corresponding to a quantity of hyperpolarized gas during transport and/or at a destination site, particularly in the presence of stray magnetic fields.

It is an additional object of the present invention to provide a method for determining the polarization of the gas in a manner which accounts for NMR coil resonance to more accurately measure the polarization level of the gas.

These and other objects of the present invention are provided by a portable monitoring system for determining the polarization of hyperpolarized gas in transit. The method includes transporting a quantity of hyperpolarized gas from a first site to a second site and intermittently transmitting a predetermined excitation pulse to the quantity of hyperpolarized gas during the transporting step. An NMR signal corresponding to the response of the hyperpolarized gas to the excitation pulse is received. The magnitude of this signal is then multiplied by a calibration factor and the level of polarization of the hyperpolarized gas is determined. The method also preferably includes the step of selecting the excitation pulse such that a plurality of transmitted pulses are substantially non-depolarizing to the quantity of hyperpolarized gas. In a preferred embodiment, the received signal is analyzed and a frequency-dependent correction factor is applied to adjust the signal polarization value to compensate for any externally-induced frequency shift that may appear in the measured signal value.

Another aspect of the present invention is directed toward a portable monitoring system for determining the polarization level of a quantity of hyperpolarized gas product. The system includes positioning a NMR coil proximate to a quantity of hyperpolarized gas product packaged for transport from a first site to a second site and transmitting an excitation pulse to the NMR coil to, in turn, excite the hyperpolarized gas product. A signal corresponding to the response of the hyperpolarized gas product to the excitation pulse is received by the NMR coil and the response signal is analyzed to determine the polarization level of the hyperpolarized gas product during transport. The system also includes an adjustment means for compensating the magnetic field strength associated with a magnetic holding field that is positioned such that it is operably associated with the quantity of hyperpolarized gas during transport. In a preferred embodiment, the adjustment means can be used to alter the magnetic field so that a transmit and receive frequency used for monitoring the gas corresponds to an optimal value associated with the NMR coil resonance.

In a preferred embodiment, the hyperpolarized gas product is held within a transport unit having a cylindrically or longitudinally extending solenoid coil used to generate a magnetic holding field for the hyperpolarized gas. Also preferably, the portable monitoring system includes a current input adjustment means which is configured to compensate for detected magnetic holding field strength fluctuations (such as to change or increase the current into the solenoid used to generate a magnetic holding field for the hyperpolarized gas or product held in a chamber therewithin to optimize the field strength of the magnetic holding field).

An additional aspect of the present invention is a computer program product for monitoring and/or determining the polarization level of a hyperpolarized gas product. The computer program product comprises a computer readable storage medium having computer readable program code means embodied in said medium, the computer readable program code means comprising a computer readable program code means for selecting an excitation pulse. The program also includes a computer readable program code means for transmitting the selected excitation pulse to a quantity of hyperpolarized noble gas product and a computer readable program code means for analyzing a signal associated with the response of the hyperpolarized noble gas product to the excitation pulse. The program further includes a computer readable program code means for compensating the response signal such that it more accurately corresponds to the hyperpolarization level of the gas and a computer readable program code means for determining the polarization level of the hyperpolarized gas.

In a preferred embodiment, the computer program product also comprises a computer readable program code means for generating a correction factor table corresponding to a Fourier transform of an NMR coil response and a computer readable program code means for applying a correction factor corresponding to the frequency of a measured response to produce a corrected value.

Another aspect of the present invention is directed to a portable transport unit for hyperpolarized gas in combination with monitoring apparatus. The apparatus comprises a portable transport unit configured to hold a quantity of hyperpolarized gas therein and a NMR coil configured and sized to be positioned in a portable transport unit such that it is proximate to a quantity of hyperpolarized gas product. The apparatus also includes a pulse generator for generating an excitation pulse. The apparatus additionally includes transmit and receive means operably associated with the pulse generator and the NMR coil. The transmit means transmits the excitation pulse to the hyperpolarized gas via the coil and the receive means receives a signal corresponding to the response of the hyperpolarized gas to the transmitted excitation pulse. A signal analyzer is operably associated with the receive means. The analyzer includes a computer readable program code means for determining the polarization level of the hyperpolarized gas during transport.

In a preferred embodiment, the combination monitoring system and portable transport unit comprises a solenoid configured to generate an adjustable electromagnetic holding field proximate to the quantity of hyperpolarized gas and the adjustability of the holding field corresponds to the current input to the solenoid. The present invention is advantageous because the monitoring system is portable and readily engaged to a transport device. Further, the portable monitoring system can correct for environmentally-induced signal shift and yield a more accurate $T_1$ value for the hyperpolarized gas. In addition, the portable monitoring system can provide feedback about ambient conditions or about temporal magnetic holding field variations and allow for the adjustment of same to minimize the depolarizing effects attributed to stray magnetic fields, especially deleterious oscillating fields which can easily dominate other relaxation mechanisms. Preferably, the monitoring system can automatically adjust the current provided to the solenoid that generates the magnetic holding field. The automatic adjustment (and/or with user input) can shift the strength of the magnetic holding field according to external or internal (circuitry) parameters; for example, to shift the resonance frequency of the hyperpolarized gas away from an external deleterious event (such as a proximate static magnetic field). In addition or alternatively, the monitoring system can detect field drift due to temperature-induced resistance variation in the coil(s) and adjust the current input to the solenoid to maintain the desired field strength. Further, the monitoring system can verify the level of polarization at the destination site providing an easy inspection device for receiving inspection purposes/delivery verification. Indeed, the monitoring system is preferably configured such that the hyperpolarized gas can be analyzed within the transport unit such that the hyperpolarized gas can be checked both during transit and at the end use site without removing the relatively fragile gas container from the transport unit. Advantageously, the monitoring system can verify via an on-board portable non-destructive test (NDT) method, that the transported product meets the applicable polarization level standard at an incoming/receiving inspection dock and/or immediately prior to use.

BRIEF DESCRIPTION OF THE DRAWINGS

FIG. 8 is a graphic user interface of a preferred set of pulse parameters for determining coil resonance to be used with the monitoring system according to a preferred embodiment of the present invention.

FIG. 10 illustrates a "look-up" correction chart for compensating a received signal according to the present invention.

DETAILED DESCRIPTION OF THE INVENTION

Figure 1:
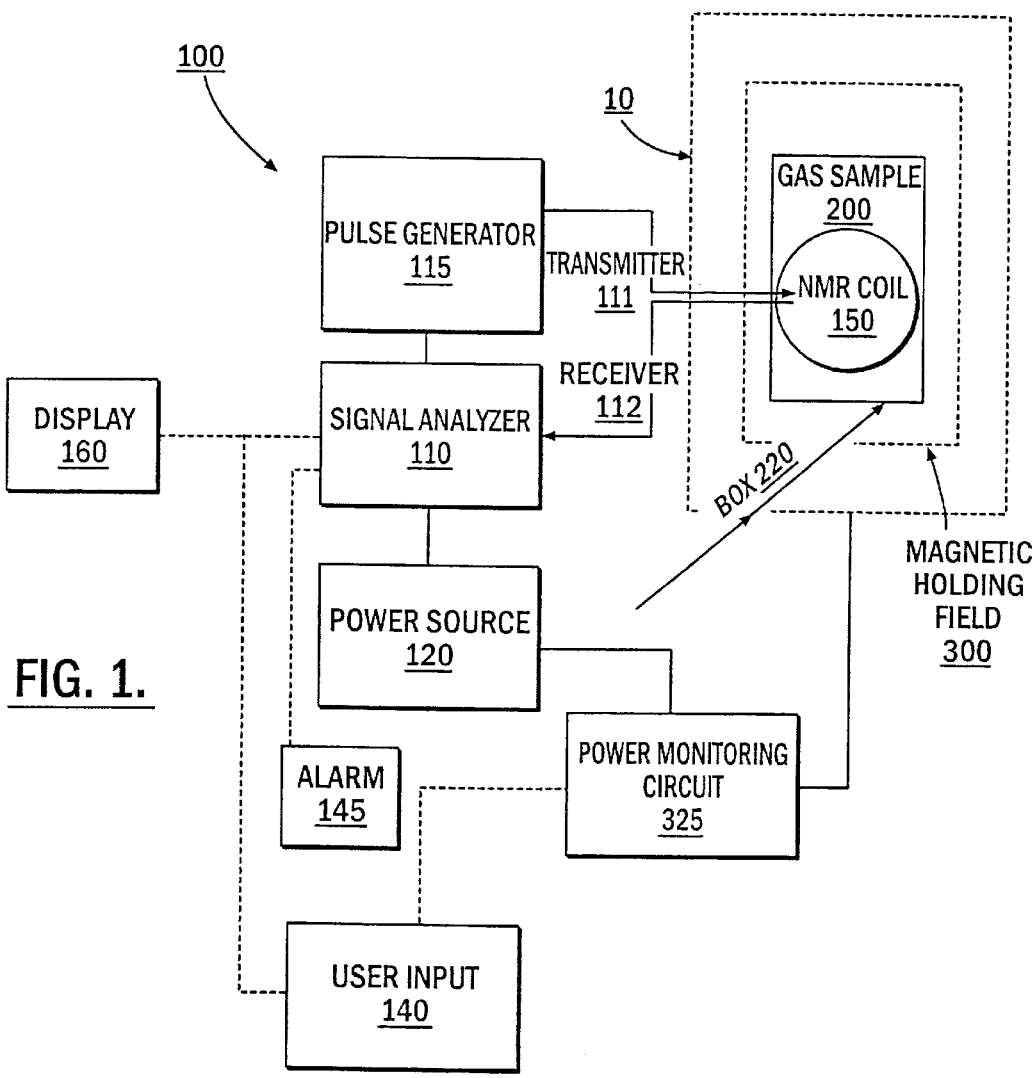
FIG. 1 is a schematic illustration of a portable monitoring system according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. In the figures, layers and regions may be exaggerated for clarity.

As will be appreciated by one of skill in the art, the present invention may be embodied as a method, data processing system, or computer program product. Accordingly, the present invention may take the form of an entirely hardware embodiment, an entirely software embodiment or an embodiment which combines software and hardware aspects. Furthermore, the present invention may take the form of a computer program product on a computer readable storage medium having computer readable program code means embodied in the medium. Any suitable computer readable medium may be utilized including for example, hard disks, CD-ROMs, optical storage devices, or magnetic storage devices.

For ease of discussion, the term "hyperpolarized gas" will be used to describe a hyperpolarized gas alone, or a hyperpolarized gas that contacts or combines with one or more other components, whether gaseous, liquid, or solid. Thus, the hyperpolarized gas described herein can be a hyperpolarized gas composition/mixture (preferably non-toxic such that it is suitable for in vivo introduction) such that the hyperpolarized noble gas can be combined with other noble gases and/or other inert or active components. Also, as used herein, the term "hyperpolarized gas" can include a hyperpolarized gas-based product in which the hyperpolarized gas is dissolved into another liquid (such as a carrier fluid) or processed such that it transforms into a substantially liquid state, i.e., "a liquid polarized gas", or alternatively is mixed or combined with other gases, or other active or inactive components or substances. Thus, the term "gas" is used to descriptively indicate a gas which has been polarized in the gaseous state. In summary, as used herein, the term "hyperpolarized noble gas" can include a product or composition wherein the hyperpolarized gas is combined, formulated, or mixed with one or more components and may be present in one or more physical forms.

Background—Hyperpolarization

Various techniques have been employed to polarize, accumulate and capture polarized gases. For example, U.S. Pat. No. 5,642,625 to Cates et al. describes a high volume hyperpolarizer for spin-polarized noble gas and U.S. Pat. No. 5,809,801 to Cates et al. describes a cryogenic accumulator for spin-polarized $^{129}$Xe. The disclosures of these patents are hereby incorporated herein by reference as if recited in full herein. As used herein, the terms "hyperpolarize" and "polarize" are used interchangeably and mean to artificially enhance the polarization of certain noble gas nuclei over the natural or equilibrium levels. Such an increase is desirable because it allows stronger imaging signals corresponding to better MRI images of the substance in a targeted area of the body. As is known by those of skill in the art, hyperpolarization can be induced by spin-exchange with an optically pumped alkali-metal vapor or alternatively by metastability exchange. See U.S. Pat. No. 5,545,396 to Albert et al. The alkali metals capable of acting as spin exchange partners in optically pumped systems include any of the alkali metals. Preferred alkali metals for this hyperpolarization technique include Sodium-23, Potassium-39, Rubidium-85, Rubidium-87, and Cesium-133.

Alternatively, the noble gas may be hyperpolarized using metastability exchange. (,See e.g., Schearer, L. D., *Phys Rev*, 180:83 (1969); Laloe, F., Nacher, P. J., Leduc, M., and Schearer L. D., AIP ConfProx #131 (Workshop on Polarized $^3$He Beams and Targets) (1984)). The technique of metastability exchange involves direct optical pumping of, for example, $^3$He without the need for an alkali metal intermediary. Since this process works best at low pressures (0–10 Torr), a compressor is typically used to compress the $^3$He after the hyperpolarization step.

Regardless of the hyperpolarization method used, once the active mechanism is no longer in effect, the polarization of the gas will inevitably decay toward its thermal equilibrium value, which is essentially zero. The present invention is configured to work with any hyperpolarization technique and is not limited to working with any one machine, method, or gas.

Polarized Gas Relaxation Processes

Under most circumstances, the non-equilibrium polarization P(t) of a gas decays according to $$dP(t)/dt = -P(t)/T_1 \qquad 1.0$$

where the instantaneous decay rate results from a combination of mechanisms as expressed by the following mathematical expression:

$$1/T_1 = (1/T_1)_{Gas} + (1/T_1)_{Surface} + (1/T_1)_{EMI} + (1/T_1)_{Gradient} \quad 2.0$$

These mechanisms are discussed in more detail in co-pending and co-assigned U.S. patent application entitled, "Hyperpolarized Gas Containers, Solenoids and Transport and Storage Devices and Associated Transport and Storage Methods," identified by Attorney Docket No. 5770-16. The contents of this disclosure are hereby incorporated by reference as if recited in full herein.

As will be appreciated by those skilled in the art, these relaxation mechanisms can themselves be time-dependent. For example, transporting a hyperpolarized gas or hyperpolarized product can potentially and/or unpredictably expose the sensitive hyperpolarized gas or product to EMI or gradient relaxation mechanisms, each of which can be particularly destructive to the sensitive polarized state of the gas. The instant invention recognizes such potential and now provides a reliable and portable polarization monitoring system which can generate a rapid (substantially instantaneous) quantitative measurement of the viability of the hyperpolarized gas undergoing evaluation. In addition, the portable monitoring system of the instant invention can be used to minimize the effects of certain external potentially deleterious conditions.

Electromagnetic Interference

The relaxation mechanism expressed by the term $(1/T_1)_{EMI}$ is the relaxation induced by time-dependent electromagnetic fields. Indeed, EMI can potentially destroy the hyperpolarized state of the gas (EMI is particularly problematic if coherent at the magnetic resonance frequency). Unfortunately, EMI can be generated by relatively common sources. For example, EMI is typically generated from a vehicle's engine, high voltage lines, power stations and other current carrying entities. As such, transport away from the hyperpolarized gas production site can expose the hyperpolarized gas to these undesirable relaxation sources that, in turn, can dramatically reduce the polarization lifetime of the transported gas.

Fluctuating fields are particularly deleterious if they are coherent at the magnetic resonance frequency. In a severe case scenario of a highly coherent oscillating field, the relaxation rate can be assumed to be comparable to the Rabi frequency:

$$(1/T_1)_{EMI} \approx \gamma H_{AC}/2 \quad 3.0$$

Here, "$\gamma$" is the gyromagnetic ratio of the spins, and "$H_{AC}$" is the magnitude of the transverse fluctuating field. A resonant field $H_{AC}$ of only 1 $\mu$G can cause relaxation on a time scale of order 100 s for $^3$He. On the other hand, if the field is randomly fluctuating, the relaxation rate is given by $$(1/T_1)_{EMI} = \gamma^2 <H_{AC}^2> \tau_c/(1+\omega^2\tau_c^2) \quad 4.0$$

where "$\tau_c$" is the autocorrelation time of the fluctuations, "$\omega$" is the Larmor frequency of the spins, and "$<H_{AC}^2>$" is the mean value of the square of the fluctuating transverse field component. In the random fluctuation case, the rate can be suppressed by increasing $\omega$, (which is proportional to the holding field strength), particularly if $\omega\tau_c > 1$. In either case, the relaxation rate can be suppressed by reducing the magnitude of the interference $H_{AC}$.

Magnetic Field Gradients

Magnetic gradient relaxation $((1/T_1)_{Gradient})$ involves the relaxation attributed to the exposure of the hyperpolarized noble gases to inhomogeneous static magnetic fields. Generally stated, as the polarized gas atoms diffuse or move through an inhomogeneous magnetic field, they experience a time-dependent field, which can introduce depolarizing activity onto the hyperpolarized atoms.

As will be appreciated by those of skill in the art, during transport, it is desirable to avoid inhomogeneous magnetic fields, i.e., to avoid nearby ferromagnetic and paramagnetic objects. For example, it is desired to maximize the spatial distance between the hyperpolarized gas and objects like car frames and axles, which can have static spatial gradients of varying strength.

Shielding

The present invention recognizes that unless special precautions are taken, relaxation due to stray magnetic fields (static and/or EMI) can dominate all other relaxation mechanisms. As discussed above, both gradients in the static field and (low frequency) oscillating magnetic fields experienced by the hyperpolarized gas can cause significant relaxation. The stray magnetic fields can be especially problematic when shipping a polarized product from one site to another. Advantageously, the portable monitoring system of the instant invention is preferably configured to engage with a transport unit which generates an applied magnetic holding field "$B_H$" to substantially protect the hyperpolarized gas from potentially depolarizing effects attributed to one or more of the EMI and gradient fields during transport. The transport unit win be discussed further below.

Figure 2:
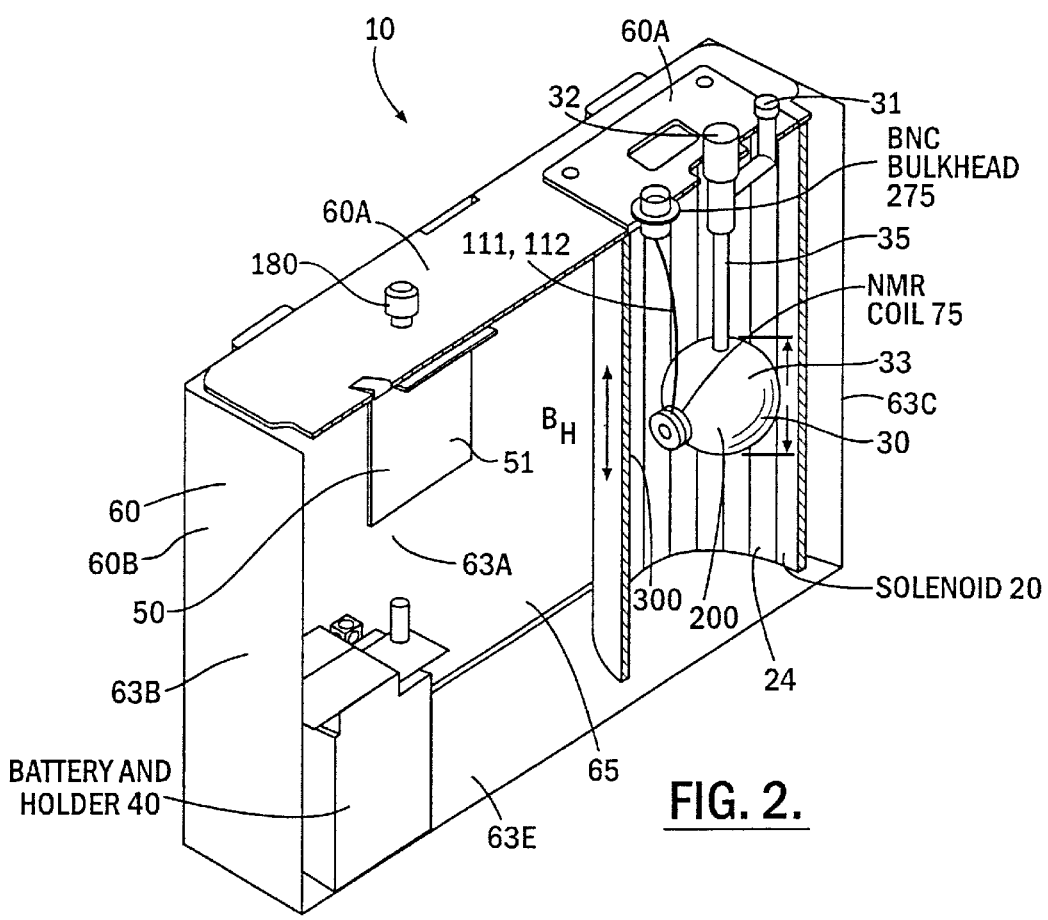
FIG. 2 is a cutaway front perspective view of a transport unit comprising a gas chamber and solenoid according to the present invention.

In a preferred embodiment, as schematically illustrated in FIG. 1, the portable monitoring system 100 of the present invention can engage with a shielded and portable or storable container or transport unit 10 (the transport unit components are illustrated as outer dotted line) to provide feedback and allow a user (preferably automatically or semi-automatically) information relevant to the status of the polarized gas or related operational details of the transport unit 10. For example, the monitoring system 100 is preferably configured to determine when or if an adjustment is needed to optimize an applied magnetic holding field ("$B_H$") 300. Referring to FIG. 2, when used with the transport unit 10 which comprises a solenoid 20 to generate the magnetic holding field 300, the monitoring system 100 is preferably configured to increase the current input to the solenoid 20 to raise the Larmor frequency of the hyperpolarized gas above a region of noise (1/f), i.e. the region where the intensity of ambient electromagnetic noise is typically high.

Preferred gas containers 30 and shielded transport units 10 are disclosed in copending and co-assigned U.S. patent application entitled, "Hyperpolarized Gas Containers, Solenoids and Transport and Storage Devices and Associated Transport and Storage Methods," identified by Attorney Docket No. 5770-16. As stated above, the contents of this disclosure are hereby incorporated by reference as if recited in full herein.

Referring again to FIG. 1, generally described, the monitoring system 100 of the instant invention determines the polarization level of the polarized gas 200 (or polarized gas based product) during transport. Preferably, the monitoring system 100 also activates, directs, adjusts, compensates for and supplies the power or input needed for the magnetic holding field (shown by dotted line as inner box 300) operably associated with a hyperpolarized gas 200 (shown enclosed by box 220). As noted above, the magnetic holding field 300 is selected and positioned proximate to the polarized gas 200 such that it reduces the hyperpolarized gas's 200 sensitivity to potentially depolarizing sources, such as static and/or oscillating magnetic field gradients. By applying a magnetic holding field (preferably an adjustable static field) which is sufficiently homogeneous, the applied field substantially supersedes ambient fields, which reduces gradient-induced relaxation during transport. Additionally, in operation, depolarizing events such as external EMI or oscillating fields are preferably (substantially) blocked by adjusting the field strength of the magnetic holding field ($B_H$) 300 proximate to the gas 200 so that the gas-attendant magnetic field ($B_0$) is increased (to increase the resonant frequency of the hyperpolarized gas). Application of a homogeneous magnetic holding field 300 proximate to the hyperpolarized gas 200 can help minimize the gas depolarization by pushing the resonant frequency of the gas outside the bandwidth of common AC fields. It is preferred that the resonant frequency of the hyperpolarized gas be raised such that it is above about 10 kHz, and more preferably the resonant frequency be raised such that it is between about 20–30 kHz.

Stated differently, it is preferred that the magnetic holding field 300 has a field strength in the range of about 2 gauss-35 gauss. It is more preferred that for $^{129}$Xe, the magnetic holding field is preferably at least about 20 gauss; and for $^3$He, the magnetic holding field is preferably at least about 7 Gauss.

Portable Monitoring System (Polarimetry)

As schematically shown in FIG. 1, the portable monitoring system 100 of the present invention preferably includes a signal analyzer 110, a pulse generator 115, a transmit/receive element preferably a NMR coil) 150, a power source 120 (preferably a DC battery for easy transport), and a power monitoring circuit 325. The portable monitoring system 100 also includes an input pulse transmitter 111, and a signal receiver 112 (which can be the same line) and which are operably associated with the signal analyzer 110 and the NMR coil 150 (positioned adjacent the hyperpolarized gas sample 200). As discussed above, in a preferred embodiment, the portable monitoring system 100 is configured to engage with a portable transport unit 10. As such, certain of the operational circuitry is preferably configured to engage with the transport unit 10 such that the portable monitoring system 100 is dominant and can direct the power input into the transport unit 10.

Preferably, as shown in FIG. 2, the NMR coil element 150 is a NMR surface excitation coil 75 which is positioned to contact the container 30 holding the hyperpolarized gas (or hyperpolarized gas based product) which is preferably held within a magnetic holding field $B_H$ 300. As such, the magnetic holding field 300 is preferably generated by a magnetic field source such as a set of permanent magnets or a solenoid, such as internal solenoid 20, positioned in the transport unit 10 itself and is configured to provide a homogeneous holding region for the quantity of gas held therein. It is also preferred that the portable monitoring system 100 is configured to engage with a transport unit 10 with an internal solenoid 20 in a manner which allows the system 100 to control or adjust the power output level of the solenoid 20 which generates the magnetic holding field 300. Optionally, as shown in FIG. 1, the portable monitoring system 100 can also include a display 160 for visually indicating various desired parameters such as the polarization level of the gas, the elapsed transit time (age of the gas), the field strength of the magnetic holding field, and the like.

Preferably, as shown in FIG. 1, the portable monitoring system 100 also includes a user input 140 for allowing a user to adjust various parameters (power adjustment, pulse characteristics, field strength, on/off switch, and the like) in response to external conditions. In a preferred embodiment, the portable monitoring system's 100 power monitoring circuit 325 is electrically connected to the power source 120 and an externally accessible user input 140. The user input 140 can allow a user to change certain operational parameters. For example, the user input 140 can be used to allow a user to set desired frequency, current, or other parameters associated with the signal analyzer 110, pulse generator 115, power source 120, or power monitoring circuit 325. Generally described, in operation, a selected RF pulse (of predetermined frequency, amplitude, and duration) is transmitted from the pulse generator 115 to the NMR surface coil 150.

The signal analyzer 110 is preferably operably associated with a portable laptop computer (500, FIG. 5) but can also be operative with other electronic and/or hardware equipment. The power monitoring circuit 325 can be configured as described for the transport unit 10 below. Generally summarized, the power monitoring circuit 325 is preferably configured to automatically switch the power source 120 from a battery to an external source upon electrical engagement with same to preserve the charged state of the battery (and can include a battery charger to recharge the internal battery during the external powering). Further, the portable monitoring system 100 also preferably includes an alarm 145 to alert the user to potential problems such as external environmental conditions, low magnetic holding field strength, low battery power, low polarization levels, current fluctuation in the solenoid 20, and the like.

Figure 4:
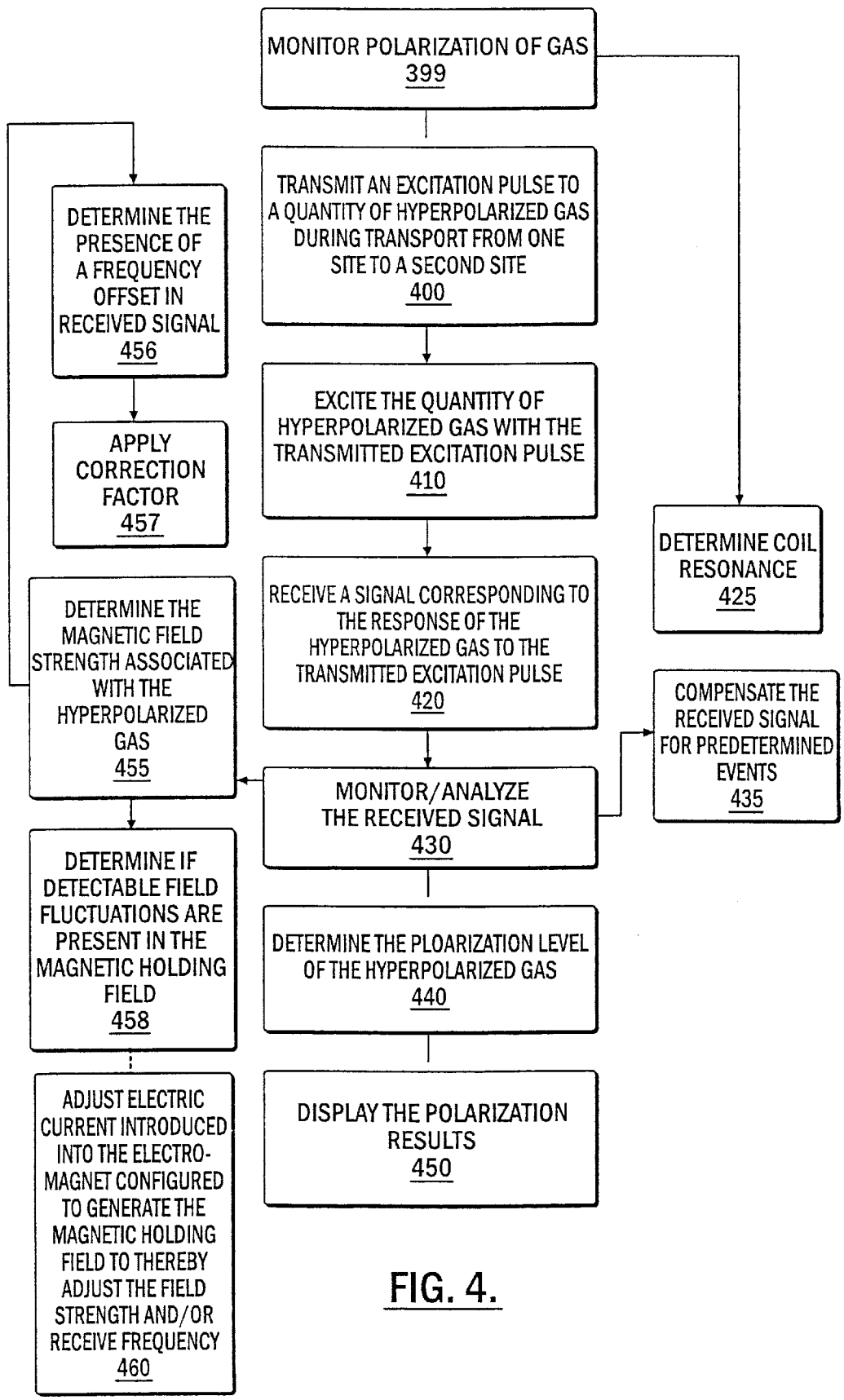
FIG. 4 is a flow chart of a system for monitoring or determining (in transit) the polarization level of a quantity of hyperpolarized gas.

Generally described, as diagrammatically shown in FIG. 4, in operation, a monitoring method is used to monitor the polarization of the hyperpolarized gas (Block 399). At least once, a NMR coil resonance frequency (Block 425) is determined. This value should be stable during most transports, however, the coil resonance may shift over long periods of use or after re-assembly, and, as such, a new NMR coil resonance value is preferably established prior to each new transport.

The pulse generator 115 transmits a (selected) excitation pulse to the surface coil 150 (FIG. 1) (Block 400, FIG. 4)). The transmitted excitation pulse locally excites a small fraction of the hyperpolarized gas sample or hyperpolarized gas based product 200 (FIG. 1) (Block 410, FIG. 4). The hyperpolarized gas 200 responds to the excitation pulse, inducing a response signal back to the signal analyzer 110. Thus, a signal is received corresponding to the response of the gas to the excitation pulse (Block 420). The received signal is analyzed (Block 430) to determine the polarization of the hyperpolarized gas (Block 440).

Preferably, the analyzing step includes the step of determining the field strength associated with the hyperpolarized gas (Block 455). Also preferably, this step also includes the step of determining if there are any detectable magnetic field fluctuations in the holding field (to optimize the desired holding field) (Block 458).

As shown in FIG. 4, the analyzing step also preferably includes compensating the received gas monitoring signal (Block 435). Preferably, the compensating step includes analyzing the data corresponding to the received signal to compensate for predetermined events such as frequency drift or shift (such as by applying a correction factor) (Block 457) if the presence of a frequency offset in the received signal is determined (Block 456). Alternatively or additionally, the received signal can be analyzed to determine if the magnetic holding field strength needs to be adjusted to provide an optimal receive frequency. If this is needed, the method can adjust the electric current introduced into the solenoid to adjust the field strength (Block 460).

This type of analysis (and compensation and/or adjustment) can provide a more reliable value(s) for the response signal, and therefore, a more representative polarization level of the hyperpolarized gas/hyperpolarized gas-based product. Thus, the monitoring system of the present invention preferably compensates the field strength associated with the measured "received signal data" and/or corrects the received signal to correspond to the selected frequency. As noted above, the frequency-dependent correction value corresponding to the NMR coil resonance can be used to provide a more accurate polarization value.

In any event, the polarization value of the gas is determined (Block 440) based on the analyzed signal. The value can then be displayed such that it is readily externally visually discerned (Block 450). Indeed, the system can analyze the received signal to alert to transport equipment problem conditions as well as to (semi-) continuously monitor the polarization level of the gas. Preferably, the monitoring system can also act to optimize the power input to the solenoid to provide the desired (constant) holding field strength. Further, the system can be programmed to "automatically" adjust the field strength to obtain the desired receive signal frequency. Advantageously, this method can be intermittently repeated (multiple times) during transport as well as when in a stationary mode to instantaneously provide a contemporaneous and reliable measure of gas polarization.

Preferably, the excitation pulse is a RF pulse having a selected pulse time and frequency that corresponds to the strength of the magnetic field and the particular hyperpolarized gas. The frequency is preferably determined by the NMR coil analysis, discussed further below. The RF pulse generates an oscillating magnetic field which misaligns a small fraction of the hyperpolarized gas (i.e., $^3$He or $^{129}$Xe) nuclei from their static magnetic field alignment position. The misaligned nuclei start precessing at their associated Larmour frequency (corresponding to pulse frequency). The precessing spins induce a voltage in the NMR coil 75 (FIG. 2) (also schematically shown in FIG. 1 as element 150) which can be processed to represent a data signal. The voltage is received back (typically amplified) at the computer and the signal typically fits an exponentially decaying sinusoid pattern. The initial peak-to-peak voltage of this signal is directly proportional to polarization (using a known calibration constant). The computer can then calculate the polarization level, and generate predicted shelf life (i.e., a "use by" time/date) corresponding to the decay rate and the initial polarization value, or the current polarization (corrected) measurement value. Advantageously, such a portable monitoring system can be configured to continuously monitor the hyperpolarized product right up to delivery to a patient thereby insuring only sufficiently active product is introduced to a patient via inhalation or injection or the like.

Figure 6:
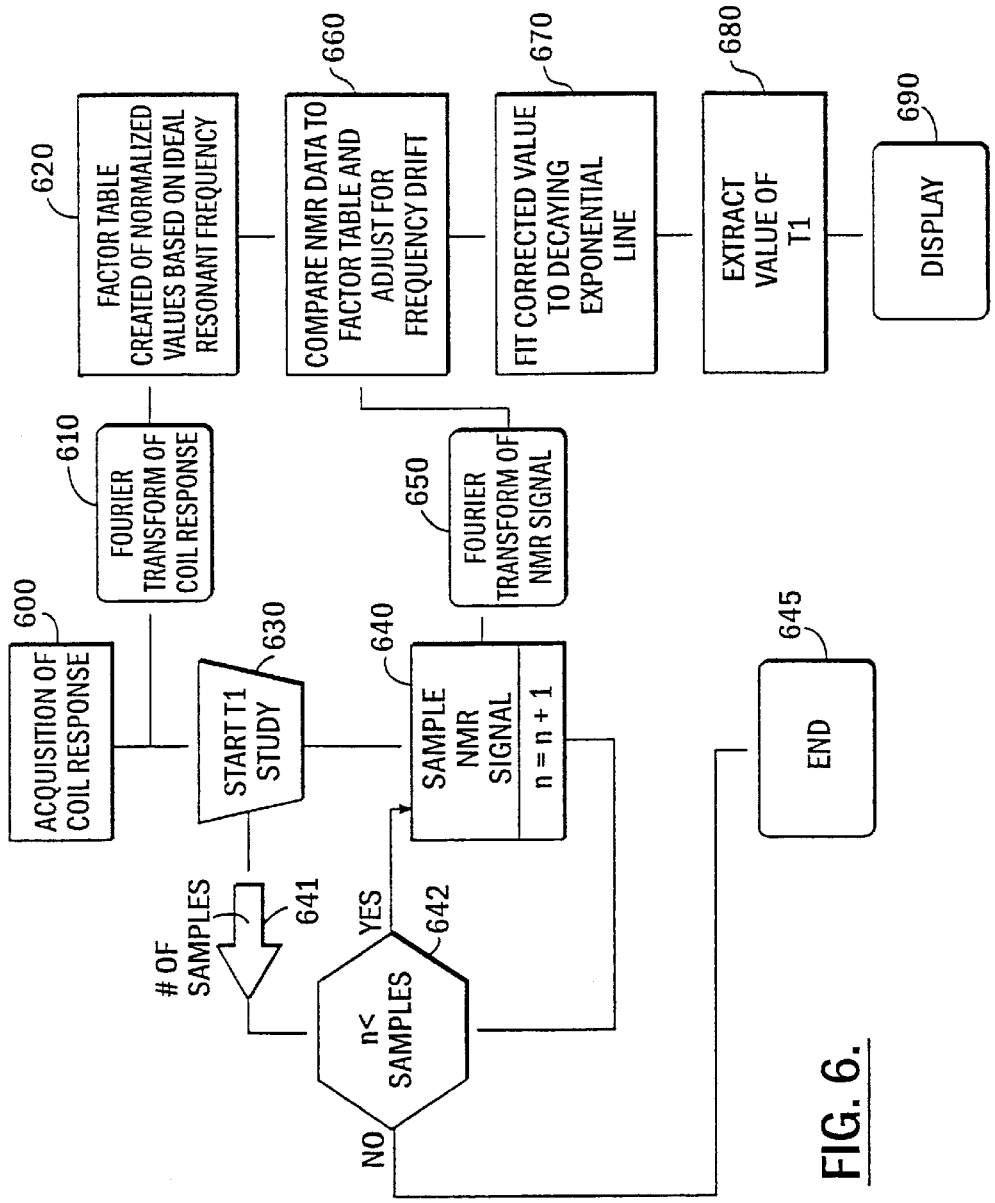
FIG. 6 is a flow chart of a system for determining the polarization level of a quantity of hyperpolarized gas by using a correction factor according to a preferred embodiment of the present invention.

In FIG. 6, a preferred NMR coil 75 optimal frequency routine is illustrated and is preferably used in the monitoring system 100 according to the present invention. As shown, the monitoring system 100 can compensate for a frequency shift that may appear in the measured response signal data to provide a more accurate or "real" measure of $T_1$ and polarization level for the hyperpolarized gas. This can be helpful in transport units which include permanent magnet holding field sources, as well as solenoid-generated magnetic fields. To obtain a $T_1$ value for the hyperpolarized gas, several temporally separated measurements of the polarization level of the gas are obtained according to the monitoring system described above. A single parameter representing the instantaneous polarization level is extracted from each measurement. These values are fit to a decaying exponential to determine the corresponding $T_1$.

Generally stated, the response received back at the signal analyzer 110 corresponding to the transmitted excitation pulse varies depending on the magnetic (holding) field strength. Further, each NMR coil 75 may have a different resonant frequency. Thus, in order to obtain a more accurate determination of the polarization level of the gas, the coil data, i.e., the resonance of the NMR coil 75, is used to define an "optimal" transmit and receive frequency for the monitoring of hyperpolarized gas. Matching the response signal's frequency to the NMR coil's 75 resonant frequency yields a more accurate and substantially contemporaneous representation of the actual status of the polarization of the gas at that time. Preferably, as will be discussed further below, the received response signal frequency is monitored to assure that it substantially corresponds to the NMR coil 75 established optimal frequency as is discussed under the NMR coil optimal frequency section below.

Figure 7:
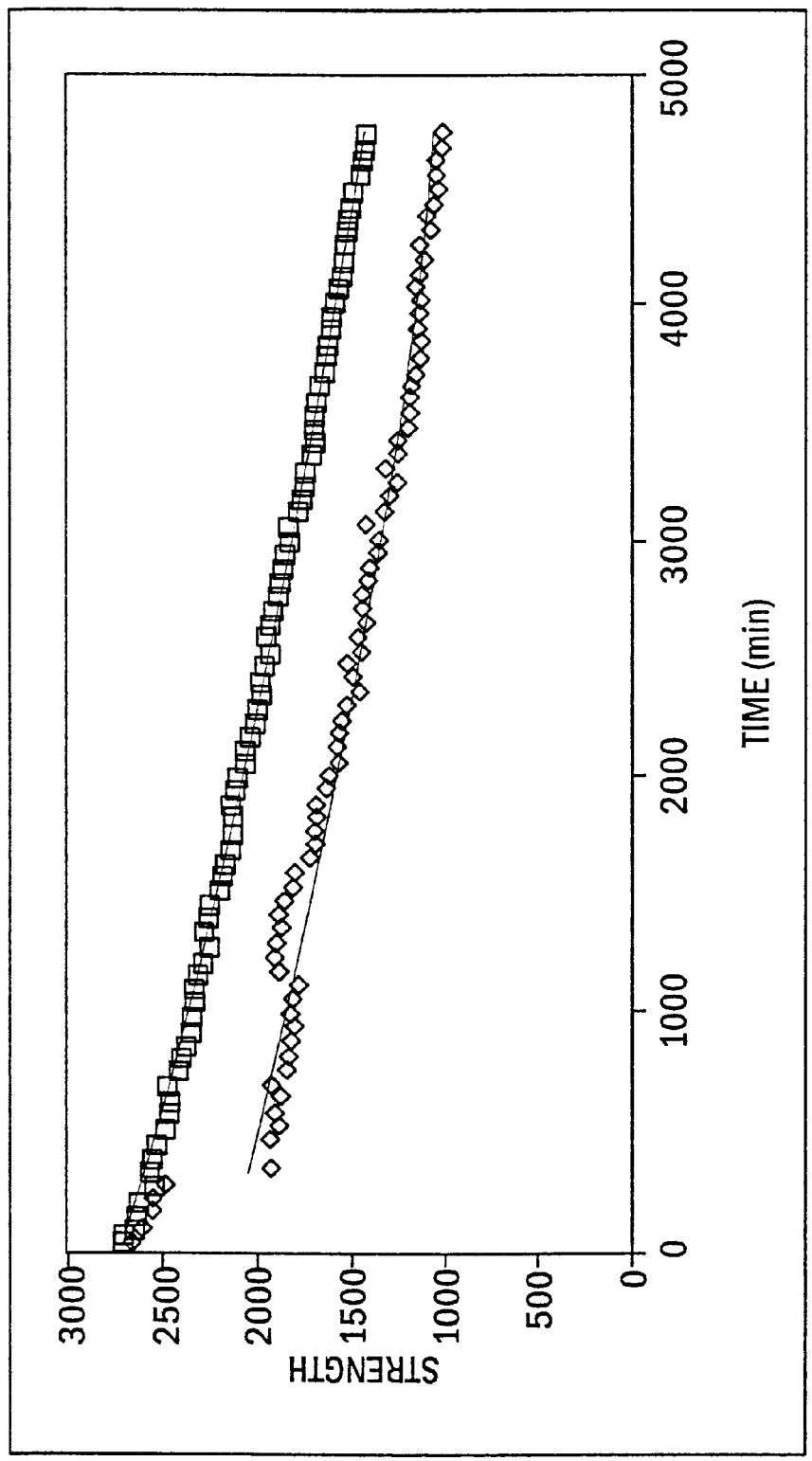
FIG. 7 is a graphical representation of a frequency corrected value (upper line—squares) versus the measured, uncorrected signal values (lower line—diamond shapes).

FIG. 7 illustrates via the lower line, a measured (uncorrected) $T_1$ of $^3$He in a sealed chamber held within a solenoid 20 which generates a magnetic holding field. The received signal data is monitored and corrected to force the received signal data to substantially emulate the values associated with the selected optimal transmit frequency and thus obtain a more accurate or "frequency corrected" signal value (upper line) for polarization measurement. The corrected signal (upper line) can be provided by applying a correction factor to the signal as discussed in the flow chart of FIG. 6 and/or by adjusting the field strength of the magnetic holding field (when adjustable) to shift or correct the frequency of the received signal once frequency drift is detected. Once the strength of the magnetic field is shifted to force the resonant frequency of the hyperpolarized product to reflect the resonant frequency of the NMR coil, subsequent measurements will be optimized. Thus, in operation, a sample data point (or points) at a first receive frequency will be monitored and if offset from predicted values, alert the monitoring system to alter the current to the solenoid to make the subsequent points correct, i.e., shift the frequency to a second frequency to match the optimal transmit frequency. The detected offset or shifted frequency data points can then be ignored in the polarization measurement or corrected by applying the appropriate correction factor. As shown, after the initial data points (fifth), the magnetic field strength changed, causing the uncorrected polarization measurements (lower line) to drop significantly. However, as also shown, the corrected data (upper line) follows the expected exponential decay curve and experiences no corresponding drop despite the field fluctuation, thus providing a more accurate measure of polarization and $T_1$.

Referring again to FIG. 6, in a preferred embodiment, the received signal is analyzed to correct for the frequency dependent signal information. As shown in Block 600, data associated with the coil is obtained. That is, a NMR excitation pulse is transmitted to the coil and a coil-ring down response is obtained using parameters such as those shown in FIG. 8. A Fourier transform is generated from the coil response.(Block 610). Additional discussion of a suitable coil resonance analysis is described below. After analyzing the coil response, the coil response analysis can be fed into a computer based "look-up" table or sub-routine which can be used to help establish a more accurate polarization based signal value as described more below. FIG. 10 illustrates a sample of a preferred correction factor "look-up" chart for an optimal frequency of 23.10 kHz. As shown in FIG. 10, the look-up chart provides a correction factor in millivolts to be applied to the received signal data based on the actual received signal frequency value (first column). Referring back to FIG. 6, as such, the coil response is used to create a "factor table" of normalized values based on ideal resonant frequency (Block 620). The NMR coil 75 will typically have a fixed response at a particular frequency and temperature, but may have an associated frequency shift over time (which can be attributed to various factors such as temperature-induced resistance variation in the coil wire, use of different cables). As such, it is preferred that a coil response analysis be performed prior to each transport unit use. Lookup tables are very useful when the magnetic field is not easily adjustable, such as for permanent magnet arrangement field sources, but of course, can also be helpful for other magnetic field sources such as the solenoid described herein.

In any event, a $T_1$ study is commenced (Block 630) and an excitation pulse is transmitted to the gas. The NMR signal is sampled (Block 640) for a desired number of samples (Blocks 641, 642 and 645), each of the samples being time related data points The received signal is monitored, i.e., a Fourier transform including data points associated with each time-related but sequential data point associated with each different polarization sample measure is generated (Block 650) The fundamental frequency of the response signal (measured) is compared to the factor table values and the response signal is corrected for frequency drift (Block 660). The corrected value is fit to correspond to a decaying exponential line (Block 670). The $T_1$ value of the hyperpolarized gas is extracted by fitting the data sample "n" corrected values (obtained in Block 670) to an exponential decaying line (Block 680). The corrected polarization value can then be displayed (Block 690).

Excitation Pulse

The present invention configures the portable monitoring system 100 such that the polarization measurement is substantially non-destructive to the hyperpolarized state of the gas. More particularly, the excitation pulse of the instant invention is selected such that it can reliably determine the level of polarization while depolarizing the gas an insignificant amount.

Portable Monitoring System with Transport Unit

Figure 3A:
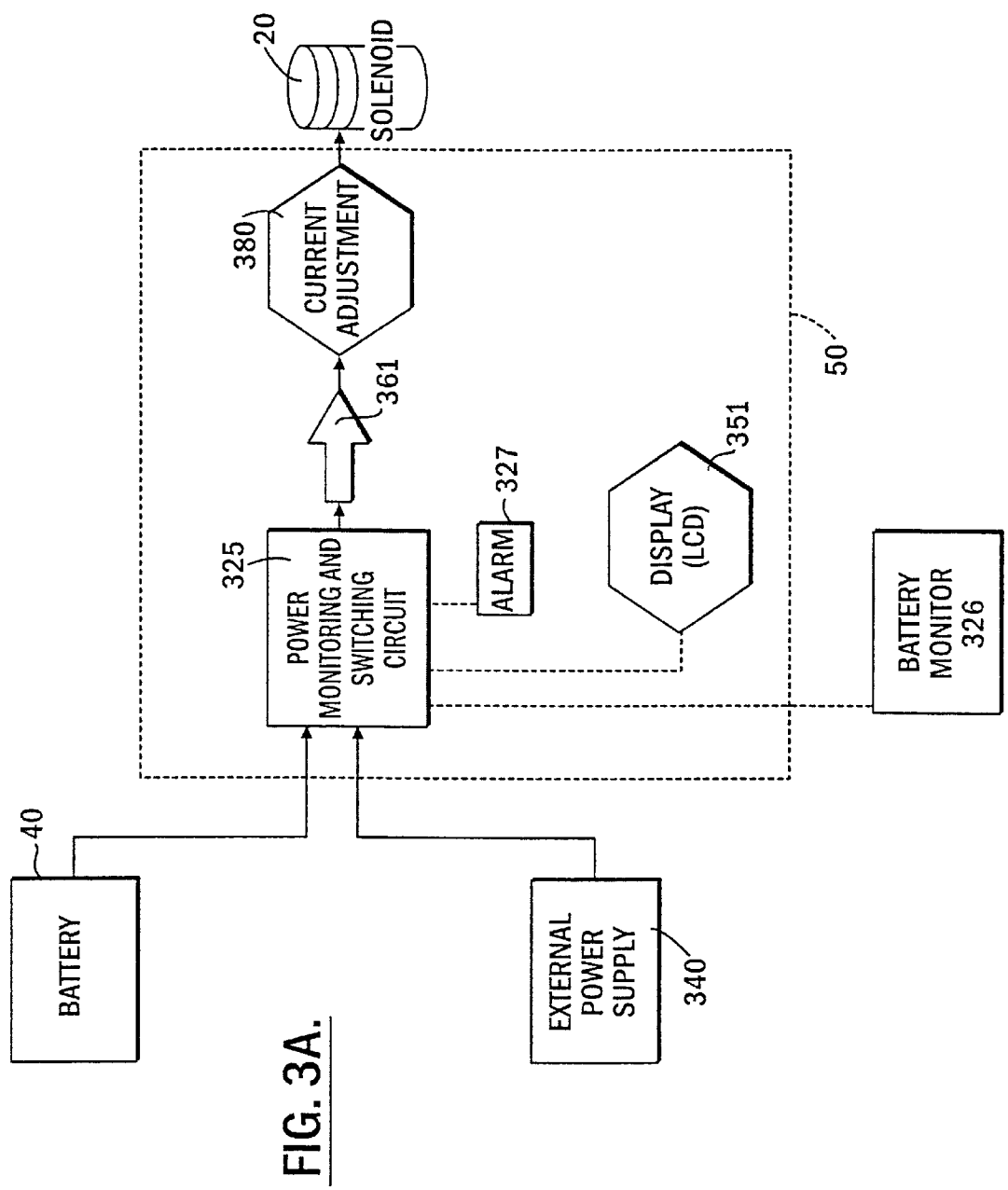
FIG. 3A is a schematic illustration of an operating circuit for use with a transport unit according to the present invention.
Figure 3B:
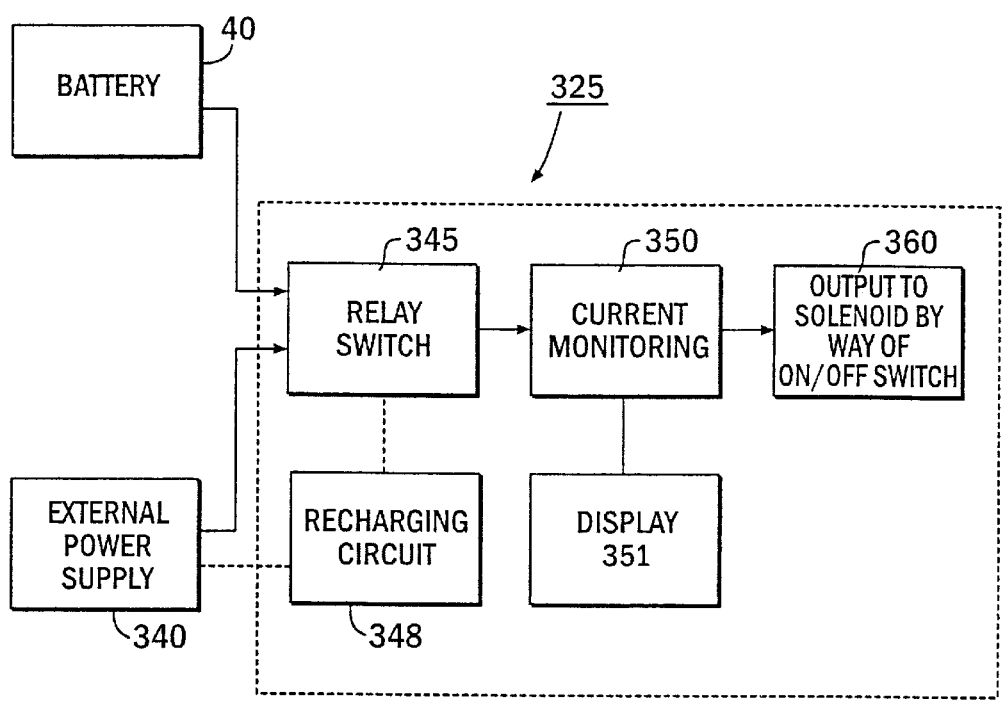
FIG. 3B is a schematic illustration of a power monitoring circuit for use with a portable monitoring system and transport unit according to the present invention.
Figure 9:
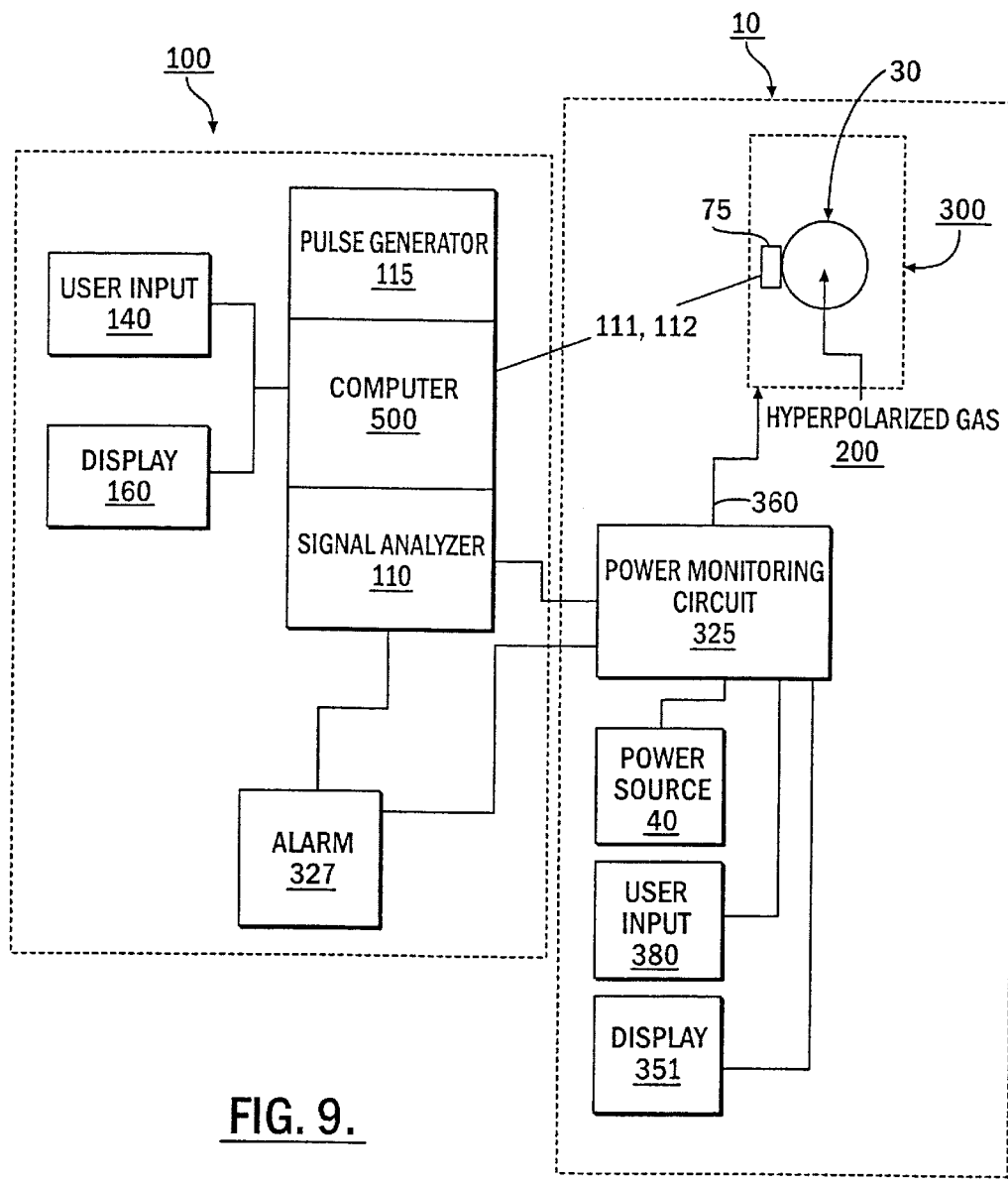
FIG. 9 is a schematic illustration of a portable combined transport unit and monitoring apparatus according to the present invention.

Preferably, as shown in FIG. 9, the monitoring system 100 is configured to engage with a portable transport unit such that it electrically connects to the power monitoring circuit 325 which is integrally mounted within or on the transport unit 10 itself. In this embodiment, it is preferred that the monitoring system 100 be configured to provide the dominant control system so as to direct the excitation pulse as well as the holding field current adjustment. FIG. 3A illustrates a preferred embodiment of operating circuitry 50 for the transport unit 10. The transport unit 10 includes a power monitoring and switching circuit 325, an on/off power switch 361 (to disengage the solenoid 20) and a current adjustment 380 to adjust current supplied to the solenoid 20). Advantageously, the power monitoring circuitry 325 is preferably configured to automatically switch between the different power sources (40, 340) without interruption of the current to either the-operating circuitry 50 or the solenoid 20. Preferably, the power monitoring and switching circuit 325 manages the power supply such that the transport unit 10 is powered from the internal power source 40 (battery) only when needed. For example, when the transport unit 10 is not easily connected to an external power source 340, the power monitoring circuit 325 engages the battery 40 to supply the power to the transport unit 10. Preferably, the power monitoring circuit 325 then disengages the battery 40 when the transport unit 10 is connected to a viable external power source 340 (such as a wall or vehicle power outlet). In a preferred embodiment, as shown in FIG. 3B, the power monitoring circuit 325 also can include a recharging circuit 348 which allows the internal battery to be recharged when the transporter is powered from an external supply 340.

Figure 5:
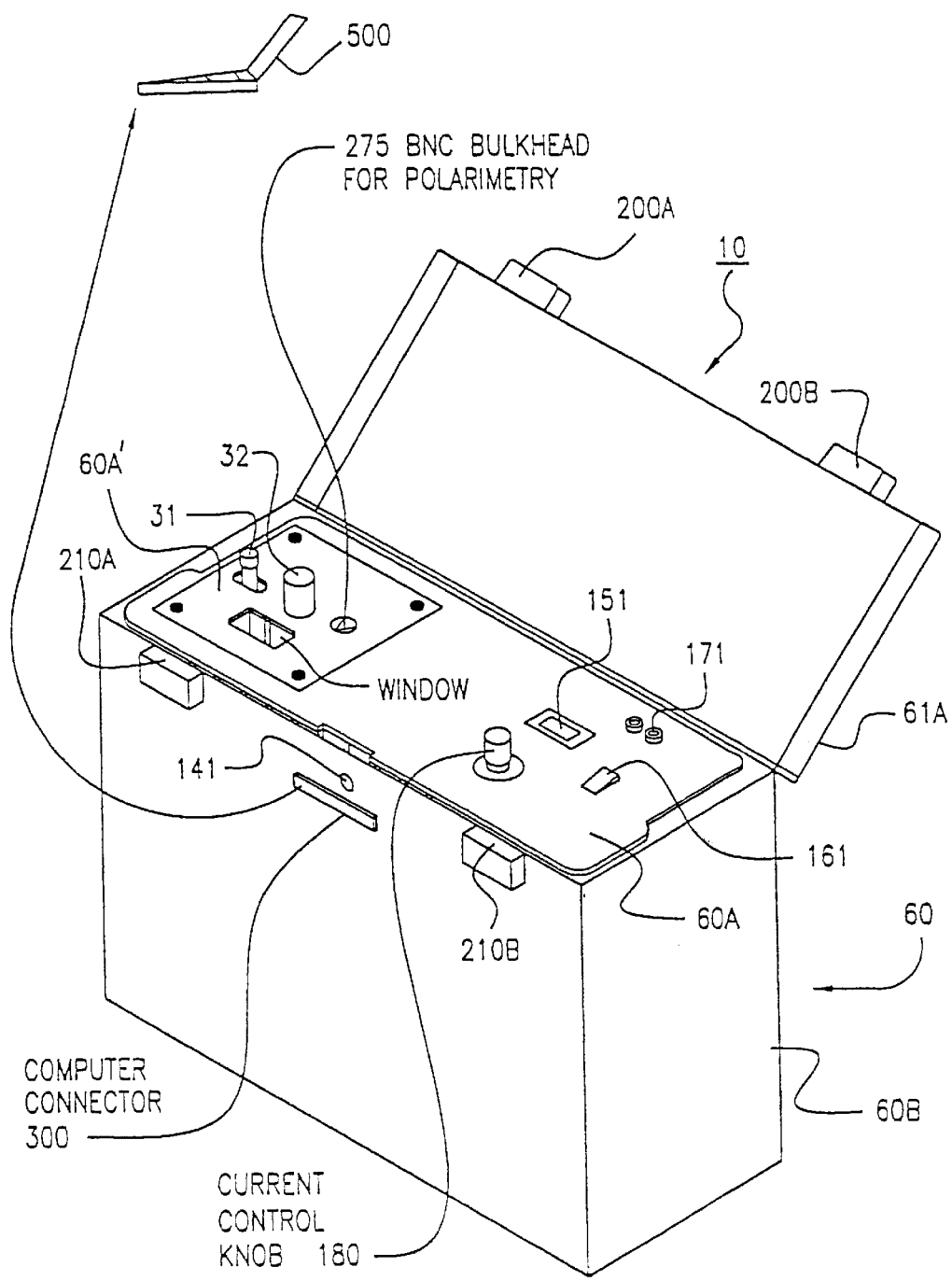
FIG. 5 is a front perspective view of the transport unit shown in FIG. 1.

Of course, as shown in FIG. 3A, the operating circuit 50 can also include other components and circuits such as a battery monitor 326 and an audible and/or visual alarm 327 to indicate when the battery 40 is low, Preferably, the transport unit 10 includes a current readout 351 (FIG. 3B) associated with the power monitoring circuit 325. As shown in FIG. 5, the current readout is an LCD display 351 which will allow a custodian to monitor the input current to the solenoid while adjusting it via the current control knob 180 (also shown in FIG. 2). Also as shown in FIG. 3A, the operating circuitry 50 preferably includes a current adjustment means 380 for increasing or decreasing the current delivered to the solenoid 20. As discussed above, the adjustable current means preferably is adjustable to supply between about 100 mA to about 2.0A.

The current adjustment 380 allows the operating circuit to change the current introduced to the solenoid 20 responsive to the needs of the transport unit. For example, the current can be adjusted to provide a custom holding field corresponding to the type of hyperpolarized gas being transported. Additionally, the current to the solenoid 20 can be adjusted to compensate for electronic or mechanical system variation (i.e., battery drainage, electronic drift, coil resistance variability due to temperature sensitivity) thereby maintaining the desired holding field strength.

As with all materials that contact, or are positioned near or proximate to the hyperpolarized gas, it is preferred that the operating circuitry 50 be devoid of magnetically active materials and components such as iron transformers. However, if such materials or components are used, then it is preferred that they be positioned a sufficient distance from the gas chamber 30 and the solenoid 20 so that they do not cause undue gradient relaxation. Further, it is preferred that temperature-sensitive diodes be removed from the operating circuit 50 in order to provide a reliable, consistent circuit which can tolerate broad temperature ranges (inside and outside). Of course the operating circuitry 50 may be present in hardware, software, or a combination of software and hardware.

As shown in FIG. 3B, the portable monitoring system 100 preferably includes a monitoring circuit 325 which includes a relay switch 345, a current monitoring circuit 350, and an output to the solenoid 360. Preferably, the monitoring circuit 325 is also operably associated with a recharging circuit 348 and can be powered either by the internal transport unit battery 40 (also shown in FIG. 2) or an external power supply 340.

Upon engagement to the transport unit 10, the signal analyzer 110 (FIG. 1) is operably configured to direct the transmit pulse and receive signals corresponding to the level of polarization in the hyperpolarized gas sample 200 being analyzed. The gas sample 200 is proximately positioned inside the magnetic holding field or shield means 300. As such, the monitoring system 100 is conveniently configured to monitor the polarization level of hyperpolarized gas before, during, or after transport (such as that contained in a gas chamber 30, FIG. 2). Advantageously, such a monitoring system 100 can be used both in transit and at a desired evaluation site. For example, when used with a transport unit such as that shown in FIGS. 2 and 5, at the end use site, prior to the release of the hyperpolarized gas 200 from the transport unit 10, the monitoring system 100 can determine a polarization level corresponding to the polarization level of the hyperpolarized gas in the transport unit 10 at that time and thus indicate to an end use site the viability of the gas prior to delivery to a patient or at a receiving station at the use site. This can confirm (reliably "inspect") the viable life of the polarized product and assure that the product meets purchase specification prior to acceptance at the use site.

As noted above, in a preferred embodiment, the polarization monitoring system can also be used with the transport unit 10 to evaluate the gas and/or magnetic holding field fluctuations during transport and can automatically (or with user input) adjust the current to compensate for detected fluctuations.

As shown in FIG. 2, the monitoring system includes a NMR signal means 75 proximately located adjacent the hyperpolarized gas. For example, as shown in FIG. 2, the signal means is a NMR surface coil 75 which is positioned such that it (securely or firmly) contacts the external wall of the storage chamber 30. The NMR coil 75 includes an input/output line such as unitary transmit/receive signal line 111 (112) which is operably associated with a signal analyzer and/or pulse generator 110, 115 (FIG. 1) (and preferably operably associated with a portable computer device 500 (FIG. 5)). Preferably, the transport unit 10 includes a computer access port 300 which is operably associated with the operating circuitry 50 and the NMR coil 75 via the BNC NMR bulkhead 275. The NMR coil 75 can be used with the monitoring system 100 to evaluate the polarization level of the hyperpolarized gas in a substantially nondestructive test (NDT) technique.

As will be recognized by those of skill in the art, other calibration or hyperpolarization level determination methods can also be employed and still be within the product identification and calibration or product-use or expiration determination methods contemplated by the present invention. For example, an alternative is to detect the minute magnetic field generated by the polarized $^3$He spins.

For transport units comprising a plurality of gas chambers 30 (not shown) it is preferred that an individual NMR coil 75 be positioned adjacent each gas chamber within the transport unit 10. It is further preferred that each gas chamber 30 be substantially electrically isolated from the other gas chambers 30, such that each gas chamber 30 is individually monitorable (individually excitable) for hyperpolarization level and each is individually tunable (adjustable field strength and coil current) according to the corresponding NMR coil 75, as will be discussed further below.

Transport Unit

In a preferred embodiment, as stated above, the monitoring system is configured to engage with a field portable transport unit such as that shown in FIG. 2. As shown, the transport unit 10 includes a solenoid 20 which is configured and sized to receive a hyperpolarized gas storage chamber 30 therein. The transport unit 10 also includes a power source 40 and operating circuitry 50 preferably provided on an internally disposed printed circuit board 51. The transport unit 10 preferably includes a substantially non-ferromagnetic metallic case or housing 60 having a predetermined skin depth appropriately sized to provide desired shielding and which includes a top 61A (FIG. 5) and sides 63A, 63B, 63C, and 63E. The top 61A opens to facilitate easy access to the exit port 31 and valve 32 of the gas chamber 30. It is preferred that the transport unit 10 be configured with a minimal amount of ferromagnetic materials on or inside the transport unit 10 (i.e., is substantially pure of ferromagnetic materials).

As shown in FIG. 5, the top of the gas chamber 61A is hinged to the bottom 60B which defines the housing 60. The top 61A includes latches 200A, 200B which engage with corresponding components 210A, 210B positioned on the outside wall of the bottom of the housing structure. Preferably, the transport unit 10 defines an enclosed volume 65 for holding the solenoid 20, the gas chamber 30 and the proximately positioned NMR coil 75 therein. Preferably, the enclosure 65 and, indeed, the entire transport unit 10, is configured and formed to be polarization friendly (substantially devoid of paramagnetic and ferrous materials) such that the transport unit 10 does not induce significant reductions in the polarization level of the hyperpolarized gas therein. One suitable housing 60 is a relatively compact aluminum case (having about a 5 mm wall thickness) manufactured by Zero Enclosures of Salt Lake City, Utah and was modified to substantially remove ferromagnetic hardware.

In its preferred position, as shown in FIG. 2, the solenoid 20 is cylindrical and is oriented such that it extends longitudinally from the opposing top and bottom ends of the transport unit 10. The coil segment(s) are circumferentially wrapped around the respective portions of the cylindrical wall of the solenoid core and are preferably configured such that the magnetic holding field $B_H$ is directed downward such that it aligns with the predominant direction of the earth's magnetic. As such, the current in the solenoid coil segment(s) is directed clockwise when viewing the solenoid 20 from the top of the transport unit. This directional alignment with the earth's dominant magnetic field can maximize the effect of the holding field at any given current. The solenoid 20 preferably includes a metallic coating (such as a layer of foil tape) 24 formed on or positioned on the inner surface (the surface proximate to the hyperpolarized gas) of the solenoid 20.

In operative position, as shown in FIG. 2, the gas chamber 30 is preferably disposed in the solenoid 20 such that the spherical or major core portion 33 of the gas chamber is positioned the area of increased homogeneity within the solenoid 20 (e.g., the center of the solenoid). The positioning can be secured by suspending the gas chamber from the top plate 60A or by positioning a non-conducting gas-friendly platform or base or the like under the gas chamber 30 (not shown).

Preferably, for transit purposes, the transport unit power source 40 is a 12V DC battery (such as those used to power motorcycles). However, at docking stations or an end-use site, the transport unit 10 can be conveniently plugged into an exterior power source to bypass and preserve the battery charge. Also preferably, as will be discussed further below, the transport unit power source 40 is configured via operating circuitry 50 to provide an adjustable current supply to the solenoid 20 of from about 100 mA to about 1.7 or 2 A. Thus, the solenoid 20 is preferably configured to provide a magnetic holding field of between about 2 to 35 gauss.

Gas Chamber

Preferably, the gas chamber 30 is configured to provide a quantity of hyperpolarized gas which can be conveniently delivered to an end point in a user-friendly single dose volume (but of course can also be configured to provide multiple or partial dose quantities) of hyperpolarized gas. In a preferred embodiment, the gas chamber is a 100–200 cm$^3$ gas spherical chamber 30. For $^3$He it is preferred that the gas chamber 30 be pressurized to about 4–12 atmospheres of pressure, and more preferably it is pressurized to about 5–11 atmospheres of pressure for storage and transport to provide a single or double dose quantity of hyperpolarized gas. Pressuring an appropriately sized gas chamber 30 can allow the hyperpolarized gas to be released through the exit port 31 as the pressure acts to equalize with ambient conditions. Thus, by merely opening the valve 32, the hyperpolarized gas can be directed via the exit port 31 to a patient or a patient delivery system with minimal handling (and thus potentially depolarizing interaction). It should be noted that for hyperpolarized $^3$He, at about 10 atm of pressure the theoretical $T_1$ is about 75 hours. Substantially higher pressures allow more product to be shipped in the container and reduces the sensitivity of the hyperpolarized gas to gradient relaxation, but the gas-gas collision relaxation can become substantial. In contrast, for $^{129}$Xe, it is preferred that the gas pressure be about 1 atm or less, because higher pressures can dramatically reduce the expected relaxation time of the hyperpolarized $^{129}$Xe (i.e., at 10 atm, $T_1$=5.6 hours).

In a preferred embodiment of the instant invention, as shown in FIG. 2, the gas chamber 30 is rigid and includes a capillary stem 35 which is sized and configured to minimize the travel of hyperpolarized gas atoms out of the spherical volume and acts to keep most of the hyperpolarized gas away from the valve 32. As such, a major portion of the hyperpolarized gas remains in the region of highest homogeneity within the solenoid 20 where it is best protected from depolarizing effects during transport. Preferably, the capillary stem 35 includes about a 1.0 mm inside diameter and has a length which is sufficient to allow proper positioning of the sphere within the region of homogeneity in the solenoid 20. In a preferred embodiment of the solenoid 20 described above, the capillary stem 35 is approximately 4 inches long. The capillary stem 35 is dimensioned such that the ratio of the chamber volume to the capillary volume is such that the diffusion time for $^3$He at fill pressure (the time it takes for the $^3$He to traverse the stem length twice) is much greater than the desired $T_1$. Also preferably, the inner diameter of the capillary stem 35 is sufficiently small as to minimize contact of the hyperpolarized atoms with the valve 32 thereby keeping a substantial portion of the hyperpolarized gas in the spherical volume 33 and thus within the high-homogeneity field region.

Alternatively, the gas chamber 30 can be formed from a resilient bag material with or without a capillary stem (not shown). Preferably, the resilient bag configuration is such that the bag is configured to be puncture resistant, moisture resistant, and oxygen resistant. It is also preferred that the bag material(s) is selected to have a low relaxivity value or solubility relative to the hyperpolarized gas held therein. See co-pending and co-assigned United States Patent Application entitled, "Resilient Containers for Hyperpolarized Gases and Associated Methods," identified by Attorney Docket No. 5770-12IP. The contents of this document are hereby incorporated by reference as if recited in full herein.

FIG. 9 schematically illustrates a preferred portable monitoring system 100 and transport unit 10 combination apparatus. As shown, the portable transport unit 10 includes the power monitoring circuit 325, the power source 40, the solenoid current input 360, the NMR coil 75, the magnetic field generator 300 (FIG. 2 illustrates this as a solenoid 20). The magnetic field is applied to surround the hyperpolarized gas 200 in a gas chamber 30. The combination apparatus also preferably includes a user input 380 and a display 351. As also shown, the portable monitoring system 100 is engaged with the transport unit 10 and includes a computer 500, a pulse generator 115, a signal analyzer 110, a display 160, a user input 140, and an alarm 327.

Establishing NMR Coil Resonance for Optimizing Gas Monitoring Frequency

The NMR coil 75 has an associated coil resonance which typically varies unit to unit (corresponding to various parameters such as lead length, BNC coupling and coil configuration). The NMR coil 75 resonance is important because it can affect the optimal transmit and receive frequency used to obtain more accurate readings of the level of hyperpolarization associated with the hyperpolarized gas. In order to determine the optimal receive and transmit frequency, the NMR coil 75 resonance is preferably determined from a coil ring-down as described below.

The NMR coil 75 can be electrically modeled as an inductor-capacitor circuit ("L-C circuit"). Therefore, the particular NMR coil 75 resonance can be determined by pulsing the NMR coil 75 with an excitation electrical pulse and letting the circuit "ring-down". For example, an electrical signal responsive to the excitation pulse will decay according to the L-C circuit model. Therefore, a coil-ring down reading can be taken to establish the optimal frequency which can be used to obtain the most sensitive or highest response from the hyperpolarized gas. The coil ring down can be done either in the presence of the hyperpolarized gas or in the absence of hyperpolarized gas (preferably at use temperature such as at ambient or room temperature) to establish a base-line coil resonance. If taken in the presence of the hyperpolarized gas, the magnetic field is increased to shift the frequency of the gas signal up so that the gas signal does not interfere with the coil signal of interest.

In operation, the NMR coil 75 resonance may change over time. For example, the resistance of the wire of the coil may vary depending on the attendant temperature. Therefore, it is preferred that the optimal frequency be determined at least just prior to transport, to assure that an optimal response frequency is set for the NMR coil to adjust for the coil variation and provide a more accurate reading of the gas polarization level. It is also preferred that any monitoring method transmit and receive the excitation signal at the optimal frequency when determining the actual polarization level of the hyperpolarized gas in order to obtain a more accurate signal value corresponding to the polarization of the hyperpolarized gas. Thus, in transit, the holding field strength can be changed (preferably adjusted by changing the current supplied to the solenoid 20) to obtain the resonance of the NMR coil 75. Other methods can be used to force the receive signal to an optimal frequency such as the lookup chart described above.

Preferably, in order to obtain the coil-ring down response, a coil ring down pulse as shown in FIG. 8 can be used. Post-mute refers to a time delay associated with the received pulse. As such, it describes the time after the pulse is transmitted but before acquisition of the data. The post-mute is preferably configured as part of the monitoring software so that it is operator- or program-adjustable by software program means.

Advantageously, by shortening the post-mute signal so that it has a delay of less than 3 ms and preferably about or less than 1 ms, the coil-responsive data can be evaluated to represent the NMR coil ring down independent of ambient field strength. From this post-mute data, the resonance of the NMR coil 75 can be established and an "optimal" gas excitation transmit and receive frequency can be determined.

Assuming that 24 kHz is the optimal frequency, in operation, a gas excitation pulse is transmitted to the gas at 24 kHz. The received signal corresponding to the response of the gas is preferably received at this same optimal frequency, 24 kHz in this example. However, the receive mode is somewhat passive and harder to directly control. Thus, typically the received signal may be offset above or below the optimal frequency, such as at 23.5 kHz in this example. Preferably, the field strength is adjusted (here raised) to assist/force the gas-related receive signal to be at 24 kHz. By setting the receive signal to the optimal frequency, a more accurate reading of the actual polarization of the gas can be obtained.

It is preferred that the monitoring system 100 be configured to operate at the same frequency irrespective of the type of hyperpolarized gas being monitored. Preferred operational optimal frequencies include those within the range of about 5–200 kHz (and are not limited to integers, i.e., 23.1 kHz, 21.3 kHz, etc.). More preferably, the transmit/receive frequency is selected from the range of about 10–100 kHz, and still more preferably in the range of about 20–50 kHz.

In a preferred embodiment, the software included in the monitoring system 100 of the present invention can automatically determine when a receive signal frequency adjustment is needed and thus provide an "automatic" polarization adjustment to yield a more accurate polarization level of the gas. In addition, or alternatively, a manual or user input can also be used. In any event, the software is preferably operably associated with the NMR coil 75 and solenoid 20 to be able to adjust the solenoid current based on desired field strength and/or NMR coil 75 resonance factors.

Computer

With the proliferation of computers throughout numerous aspects of life has come a trend to graphic user interfaces which make using a computer more intuitive. Examples of such graphic user interfaces include IBM® OS/2®, Apple® System7®, and Microsoft® Windows®. These operating systems all rely on a "window like" workspace for applications, operating system information, such as directory information, and program groupings. Preferably, the monitoring system of the instant invention is configured to provide easy to follow graphic user interfaces. FIG. 8 illustrates a preferred graphic user input window which conveniently allows a user to select desired excitation pulse parameters. As shown, the pulse parameters include a pulse time of about 0.10 ms, a post mute time of about 1.00 ms, a pulse frequency of about 24.00 kHz, a pulse amplitude of about 0.25V, a preferred maximum number of samples (n) of about 10,000, an acquisition time of about 20.00 ms, a transient length of about 0.00 ms, and a gain of about 0.5. Of course these parameters can be modified as will be appreciated by one of skill in the art. For example (but not limited thereto), the pulse parameter for the maximum number of samples can be changed to be below about 8192 and the optimal pulse frequency changed and selected from the ranges as noted above.

FIGS. 1, 4, and 6 are flow chart illustrations of methods, apparatus (systems) and computer program products according to the invention. It will be understood that each block of the flowchart illustration, and combinations of blocks in the flowchart illustrations, can be implemented by computer program instructions. These computer program instructions may be loaded onto a computer or other programmable data processing apparatus to produce a machine, such that the instructions which execute on the computer or other programmable data processing apparatus create means for implementing the functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function specified in the flowchart block or blocks. The computer program instructions may also be loaded onto a computer or other programmable data processing apparatus to cause a series of operational steps to be performed on the computer or other programmable apparatus to produce computer implemented process such that the instructions which execute on the computer or other programmable apparatus provide steps for implementing the functions specified in the flowchart block or blocks.

Accordingly, blocks of the flowchart illustrations support combinations of means for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or combinations of special purpose hardware and computer instructions.

Further, as will be appreciated by those of skill in the art, if the hyperpolarized gas product is other than gas alone, certain of the pulse parameters may be adjusted to account for the target compositional or phase differences (whether solid, liquid, or gas).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A method of monitoring the polarization of hyperpolarized gas, in transit, using NMR and/or MRI comprising the steps of:

generating a magnetic holding field having a region of homogeneity;

transporting a quantity of hyperpolarized gas from a first site to a second site in a shielded portable transport container configured to encase a vessel holding the hyperpolarized gas therein in a manner which inhibits the depolarization of the hyperpolarized gas during transport;

transmitting a predetermined excitation pulse during the transporting step to the quantity of hyperpolarized gas at least once during said transporting step;

receiving a NMR and/or MR response signal corresponding to the response of the hyperpolarized gas to the excitation pulse during the transporting step; and determining the level of polarization of the hyperpolarized gas based the received response signal.

2. A method according to claim 1, wherein said transmitting, said receiving, and said determining steps are repeated during said transporting step.

3. A method according to claim 1, wherein said transmitting, said receiving and said determining steps are repeated a plurality of times including at least once before, at least once during, and at least once after said transporting step, and wherein said method further comprises the step of selecting the excitation pulse such that a plurality of transmitted pulses are substantially non-depolarizing to the quantity of hyperpolarized gas.

4. A method according to claim 1, wherein said determining step includes the step of analyzing the received signal to account for temporal magnetic field variations, thereby providing a more accurate polarization measurement value for the hyperpolarized gas.

5. A method according to claim 4, wherein said analyzing step includes adjusting the frequency value corresponding to the received signal response to correct for frequency shifts away from a predetermined frequency.

6. A method according to claim 2, wherein the excitation pulse has a frequency corresponding to the type of hyperpolarized gas being transported.

7. A method according to claim 5, wherein for $^3$He and a magnetic holding field strength of about 7 gauss, the pulse frequency is in the range of about 20–50kHz.

8. A method according to claim 1, further comprising the step of displaying information in a format readable by a user regarding one or more of external environmental conditions, magnetic holding field strength, magnetic holding field fluctuation, and the polarization level of the gas.

9. A method according to claim 1, wherein said method is performed by a portable electronic device which is operably engaged with a portable transport unit, the transport unit having a solenoid with a plurality of coil segments which provide the magnetic holding field in response to electrical current introduced thereto, wherein the transport unit performs the step of generating a magnetic holding field, and wherein said generating step is performed such that the magnetic holding field has a field strength which substantially shields the hyperpolarized gas from the potential effect of stray magnetic field gradients during said transporting step, thus inhibiting depolarization of the hyperpolarized gas.

10. A method according to claim 9, further comprising the steps of;

detecting magnetic field fluctuations in the magnetic holding field; and adjusting the electrical current introduced into the solenoid so as to compensate for magnetic field fluctuations in the magnetic holding field.

11. A method according to claim 10, wherein said adjusting step is performed automatically, thereby acting without the need for an external user's input.

12. A method according to claim 1 further comprising holding the hyperpolarized gas in a plurality of separate chambers during the transporting step.

13. A portable monitoring system for determining the polarization level of a quantity of hyperpolarized gas product in transit using NMR and/or MRI, comprising:

positioning a NMR coil proximate to a quantity of hyperpolarized gas-based product, the NMR coil and hyperpolarized gas-based product being packaged for movement;

transporting the quantity of hyperpolarized gas-based product with the NMR coil from a first site to a second site remote from the first site after said positioning step;

transmitting an excitation pulse to the NMR coil to excite a small amount of the hyperpolarized gas-based product during said transporting step;

receiving an electrical NMR and/or MR based response signal associated with the hyperpolarized gas-based product corresponding to said transmitting step during said transporting step; and analyzing the response signal to determine the polarization level of the hyperpolarized gas product during said transporting step.

14. A portable monitoring system according to claim 13, wherein the excitation pulse is a RF pulse.

15. A portable monitoring system according to claim 13, wherein the portable monitoring system includes a portable display for visually displaying information concerning the condition of the transported hyperpolarized gas to a user.

16. A portable monitoring system according to claim 13, wherein the NMR coil has an associated coil resonance, and wherein said analyzing step includes the steps of evaluating the received response signal and adjusting for the NMR coil resonance thereby more accurately determining the polarization of the hyperpolarized gas product.

17. A portable monitoring system according to claim 16, wherein said analyzing step is performed by monitoring the received response signal value to determine the need for adjusting the received value with a predetermined correction factor.

18. A portable monitoring system according to claim 16, wherein the hyperpolarized gas product is held within a transport unit having a longitudinally extending solenoid coil and a current input therefor, and further comprising an adjustment means for compensating the current to the solenoid thereby adjusting the field strength of a magnetic holding field which is positioned such that it is operably associated with the quantity of hyperpolarized gas during transport.

19. A portable monitoring system according to claim 18, wherein said adjustment means compensates for detected magnetic holding field strength fluctuations.

20. A portable monitoring system according to claim 13 further comprising holding the hyperpolarized gas in a plurality of separate chambers during the transporting step.

21. A computer program product for monitoring and/or determining the polarization level of hyperpolarized noble gas in transit using NMR and/or MRI, the computer program product comprising:

a computer readable storage medium having computer readable program code means embodied in said medium, said computer readable program code means comprising:

computer readable program code means for selecting an excitation pulse;

computer readable program code means for transmitting the selected excitation pulse to a quantity of hyperpolarized gas held in a transport container via an NMR coil positioned proximate thereto while the hyperpolarized gas is in transit to a use site;

computer readable program code means for analyzing a received NMR and/or MR signal associated with the response of the hyperpolarized noble gas product to the excitation pulse while the hyperpolarized gas is in transit to a use site;

computer readable program code means for adjusting the received response signal such that it more accurately corresponds to the hyperpolarization level of the hyperpolarized gas; and computer readable program code means for determining the polarization level of the hyperpolarized gas in transit and/or subsequent thereto.

22. A computer program product for monitoring and/or determining the polarization level of a hyperpolarized gas product according to claim 21, further comprising:

computer readable program code means for generating a correction factor table corresponding to a Fourier transform of an NMR coil response to an RF pulse; and computer readable program code means for applying a correction factor from the correction factor table to a received signal response value to produce a more accurate polarization measurement.

23. A computer program product for monitoring and/or determining the polarization level of a hyperpolarized gas product according to claim 22, further comprising:

computer readable program code means for allowing a user to select excitation pulse parameters; and computer readable program code means for displaying the determined polarization level value.

24. A computer program product for monitoring and/or determining the polarization level of a hyperpolarized gas product according to claim 22, further comprising:

computer readable program code means for determining the elapsed transit time or time from original polarization of the quantity of hyperpolarized gas product.

25. A computer program product for monitoring and/or determining the polarization level of a hyperpolarized gas product according to claim 21, wherein said computer program product is configured to generate polarization values in response to excitation of the NMR coil during physical transport of the hyperpolarized gas from one location to a second location remote from the first location.

26. A computer program product for monitoring and/or determining the polarization level of a hyperpolarized gas product according to claim 21, further comprising:

computer readable program code means for generating an alarm when the computed polarization value is below a predetermined level.

27. A computer program product for monitoring and/or determining the polarization level of a hyperpolarized gas product according to claim 26, wherein a magnetic holding field having an adjustable electric current input is applied to a region proximate to the hyperpolarized noble gas product, and further comprising computer readable program code means for adjusting the amount of current supplied to the current input.

28. A computer program product for monitoring and/or determining the polarization level of a hyperpolarized gas product according to claim 21, further comprising:

computer readable program code means for analyzing a predetermined number of sequential response signal sample values associated with a decaying received signal and comparing the received signal sample values to predicted values and adjusting the value of the received signal sample values corresponding to the comparing step with predetermined correction values associated with an optimal transmit and/or receive frequency.

29. A computer program product for monitoring and/or determining the polarization level of a hyperpolarized gas product according to claim 23, wherein said means for adjusting is responsive to determination of magnetic field fluctuation proximate to the hyperpolarized gas in the transport unit.

30. A portable system for monitoring hyperpolarized gas during transit and/or transit and storage using NMR and/or MRI, comprising:

a portable transport unit configured to hold a quantity of hyperpolarized gas in a container held therein;

a NMR coil configured and sized to be positioned in said portable transport unit such that it is proximate to the quantity of hyperpolarized gas;

a pulse generator operably associated with said NMR coil for generating an excitation pulse to a portion of the hyperpolarized gas;

transmit means operably associated with said pulse generator and said NMR coil for transmitting the excitation pulse to the hyperpolarized gas;

receive means operably associated with said NMR coil for receiving a NMR and/or MR response signal corresponding to the response of the hyperpolarized gas to the transmitted excitation pulse; and a signal analyzer operably associated with said receive means, said analyzer including a computer readable program code means for determining the polarization level of the hyperpolarized gas;

wherein said NMR coil, said transport unit, said pulse generator, and said transmit and receive means are configured to be operative so as to receive the response signal during transport or transport and storage of the hyperpolarized gas away from the original polarization site and away from the patient hyperpolarized gas delivery location.

31. A portable system for monitoring hyperpolarized gas according to claim 30, wherein said portable transport unit comprises a solenoid configured to generate an adjustable electromagnetic holding field proximate to the quantity of hyperpolarized gas product, wherein said adjustable holding field corresponds to the amount of electric current directed into said solenoid, and wherein said portable monitoring apparatus further comprises a power monitoring circuit configured to control the amount of current directed to said solenoid.

32. A portable system for monitoring hyperpolarized gas according to claim 31, wherein said power monitoring circuit is configured to alter the amount of electrical current introduced into said solenoid based on detected fluctuations in the magnetic holding field.

33. A portable system for monitoring hyperpolarized gas according to claim 30, further comprising a display monitor.

34. A portable system for monitoring hyperpolarized gas according to claim 32, further comprising computer program code means for displaying information regarding one or more of the excitation pulse parameters, the magnitude of the magnetic holding field, and the polarization level of the hyperpolarized gas product.

35. A portable system for monitoring hyperpolarized gas according to claim 31, further comprising a user input device for allowing a user to select one or more of the excitation pulse parameters, the field strength of the magnetic holding field, and the current input to said solenoid.

36. A portable system for monitoring hyperpolarized gas according to claim 30, wherein said signal analyzer includes computer program code means for adjusting the measured value of the received signal corresponding to predetermined correction factor values.

37. A portable system for monitoring hyperpolarized gas according to claim 36, wherein the adjustment corrects the measured value of the received signal by applying a predetermined correction factor value.

38. A portable system for monitoring hyperpolarized gas according to claim 36, wherein the predetermined correction factor values correspond to the response of the NMR coil at selected operational frequencies.

39. A portable system for monitoring hyperpolarized gas according to claim 37, wherein the pulse frequency is in the range of between about 20–50 kHz.

40. A portable system according to claim 37, wherein said system is configured to operate at an excitation pulse frequency which is independent of the type of hyperpolarized gas being monitored.

41. A portable system for monitoring hyperpolarized gas according to claim 30, wherein said portable transport unit comprises a plurality of containers for holding a plurality of individual quantities of hyperpolarized gas.

* * * * *